(12) United States Patent
Shimon

(10) Patent No.: US 11,917,925 B2
(45) Date of Patent: Feb. 27, 2024

(54) MAGNETORESISTIVE DEVICES AND METHODS THEREFOR

(71) Applicant: Everspin Technologies, Inc., Chandler, AZ (US)

(72) Inventor: Shimon, Singapore (SG)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 161 days.

(21) Appl. No.: 16/750,264

(22) Filed: Jan. 23, 2020

(65) Prior Publication Data

US 2021/0234090 A1 Jul. 29, 2021

(51) Int. Cl.
| | |
|---|---|
| H01L 43/00 | (2006.01) |
| H10N 50/85 | (2023.01) |
| H10N 52/80 | (2023.01) |
| H10N 52/00 | (2023.01) |
| G11C 11/16 | (2006.01) |
| H10N 52/01 | (2023.01) |

(52) U.S. Cl.
CPC ......... *H10N 52/101* (2023.02); *G11C 11/161* (2013.01); *H10N 50/85* (2023.02); *H10N 52/01* (2023.02); *H10N 52/80* (2023.02)

(58) Field of Classification Search
CPC ..... H01L 43/065; H10N 52/101; H10N 50/85
See application file for complete search history.

(56) References Cited

U.S. PATENT DOCUMENTS

| | | | |
|---|---|---|---|
| 10,224,085 B2 | 3/2019 | Gaudin et al. | |
| 2002/0018919 A1* | 2/2002 | Saito | ................... H01F 10/3268 |
| 2006/0017081 A1 | 1/2006 | Sun et al. | |
| 2007/0096229 A1 | 5/2007 | Yoshikawa et al. | |
| 2008/0211055 A1 | 9/2008 | Assefa et al. | |
| 2012/0098077 A1 | 4/2012 | Gaudin et al. | |
| 2015/0097159 A1* | 4/2015 | Apalkov | ............. G11C 11/1659 |
| | | | 257/31 |
| 2016/0300999 A1 | 10/2016 | Yi et al. | |
| 2017/0170388 A1* | 6/2017 | Whig | ..................... H10N 50/80 |
| 2017/0178705 A1* | 6/2017 | Buhrman | ............ G11C 11/1675 |

(Continued)

FOREIGN PATENT DOCUMENTS

| | | |
|---|---|---|
| JP | 2006148039 A | 6/2006 |
| WO | 2018190964 A1 | 10/2018 |

OTHER PUBLICATIONS

Bali, R. et al., "Competing magnetic anisotropies in an antiferromagnet-ferromagnet-antiferromagnet trilayer," Journal of Applied Physics, pp. 113925-113925, vol. 106 (2009).

(Continued)

*Primary Examiner* — Moazzam Hossain
*Assistant Examiner* — Hajar Kolahdouzan
(74) *Attorney, Agent, or Firm* — Bookoff McAndrews, PLLC

(57) ABSTRACT

The magnetoresistive stack or structure of a magnetoresistive device includes one or more electrodes or electrically conductive lines, a magnetically fixed region, a magnetically free region disposed between the electrodes or electrically conductive lines, and a dielectric layer disposed between the free and fixed regions. The magnetoresistive device may further include a spin-Hall (SH) material proximate to at least a portion of the free region, and one or more insertion layers comprising antiferromagnetic material.

20 Claims, 21 Drawing Sheets

(56) References Cited

U.S. PATENT DOCUMENTS

| | | |
|---|---|---|
| 2018/0366638 A1 | 12/2018 | Lin et al. |
| 2019/0066747 A1* | 2/2019 | Lee .................. H10B 61/20 |
| 2019/0074041 A1* | 3/2019 | Jung ................. H01L 27/1222 |
| 2019/0304525 A1* | 10/2019 | Manipatruni ......... H10B 61/22 |
| 2020/0006630 A1 | 1/2020 | Sato et al. |

OTHER PUBLICATIONS

Dieny, B. et al., "Spin-transfer effect and its use in spintronic components," International Journal of Nanotechnology, vol. 7, pp. 591-614 (2010).

Lee, C-L. et al., "Enhancement of exchange bias in thin PtMn antiferromagnets by Ru and Cr nano-lamination," Journal of Magnetism and Magnetic Materials, vol. 286, pp. 200-205 (2005).

Li, K. et al., "Exchange coupling between ferromagnetic and laminated antiferromagnetic layers and its application," Journal of Applied Physics, vol. 94, pp. 5905-5911 (2003).

Lijun, Z. et al., "Energy-efficient ultrafast SOT-MRAMs based on low-resistivity spin Hall metal $Au_{0.25}Pt_{0.75}$," Advanced Electronic Materials, vol. 6 (2020).

\* cited by examiner

MAGNETORESISTIVE DEVICES AND METHODS THEREFOR

TECHNICAL FIELD

The present disclosure relates to, among other things, magnetoresistive devices and methods for fabricating and/or using the disclosed magnetoresistive devices.

INTRODUCTION

In one or more embodiments, the present disclosure relates to a magnetoresistive device having a magnetoresistive stack or structure (for example, part of a magnetoresistive memory device and/or magnetoresistive sensor/transducer device) and methods of manufacturing and operating the described magnetoresistive devices. In one embodiment, an exemplary magnetoresistive stack (for example, used in a magnetic tunnel junction (MTJ) magnetoresistive device) of the present disclosure includes one or more layers of magnetic or ferromagnetic material.

Briefly, a magnetoresistive stack used in a memory device (e.g., a magnetoresistive random access memory (MRAM)) of the present disclosure includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the free magnetic region. The direction of the magnetization vectors of the free magnetic region may be switched and/or programmed (for example, through spin orbit torque (SOT) and/or spin transfer torque (STT)) by application of a write signal (e.g., one or more current pulses) adjacent to, or through, the magnetoresistive memory stack. In contrast, the magnetization vectors in the magnetic layers of a fixed magnetic region are magnetically fixed in a predetermined direction during application of the write signal. When the magnetization vectors of the free magnetic region adjacent to the non-magnetic layer are in the same direction as the magnetization vectors of the fixed magnetic region adjacent to the non-magnetic layer, the magnetoresistive memory stack has a first magnetic state. Conversely, when the magnetization vectors of the free magnetic region adjacent to the non-magnetic layer are opposite the direction of the magnetization vectors of the fixed magnetic region adjacent to the non-magnetic layer, the magnetoresistive memory stack has a second magnetic state. The magnetoresistive memory stack has different electrical resistances in the first and second magnetic states. For example, a resistance (e.g., electrical) of the second magnetic state may be relatively higher than a resistance of the first magnetic state. The magnetic state of the magnetoresistive memory stack is determined or read based on the resistance of the stack in response to a read current applied, for example, through the magnetoresistive stack.

As magnetic memory devices (e.g., MRAM) advance towards smaller process nodes to increase density, individual MTJ bit sizes must laterally shrink to accommodate tighter pitch and space between bits. However, as the size and/or aspect ratio of the MTJ bit decreases, so does its shape magnetic anisotropy. With the decrease in shape anisotropy, the energy barrier of the MTJ may decrease. As the energy barrier decreases, however, the data retention and/or thermal stability of the MTJ bit also may decrease.

Typically, the decrease in energy barrier of the MTJ bit may be corrected by increasing the perpendicular anisotropy or magnetic moment of the free region by altering its composition/material/thickness. However, doing so also may raise the critical current (described in greater detail below) of the MTJ bit. MTJ bits with high critical currents undergo a greater amount of periodic damage and degeneration during write and/or reset operations and negatively impact MTJ device (i.e. MRAM) endurance.

The present disclosure relates to devices (e.g., devices including magnetoresistive structures and/or stacks) and methods for writing or otherwise switching the magnetic state of a magnetoresistive memory device via STT and/or SOT switching schemes. More particularly, the description that follows describes embodiments of MTJ geometries which integrate SOT and/or STT switching mechanics, individually or in combination, to provide improved switching efficiency, enabling the switching of a high energy barrier MTJ bit without the use of unnecessary high magnitudes of write current. The scope of the current disclosure, however, is defined by the attached claims, and not by any characteristics of the resulting devices or methods.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. The drawings are simplifications provided to help illustrate the relative positioning of various regions/layers and describe various processing steps. One skilled in the art would appreciate that the regions are not necessarily drawn to scale and should not be viewed as representing proportional relationships between different regions/layers. Moreover, while certain regions/layers and features are illustrated with straight 90-degree edges, in actuality or practice such regions/layers may be more "rounded", curved, and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 17A:
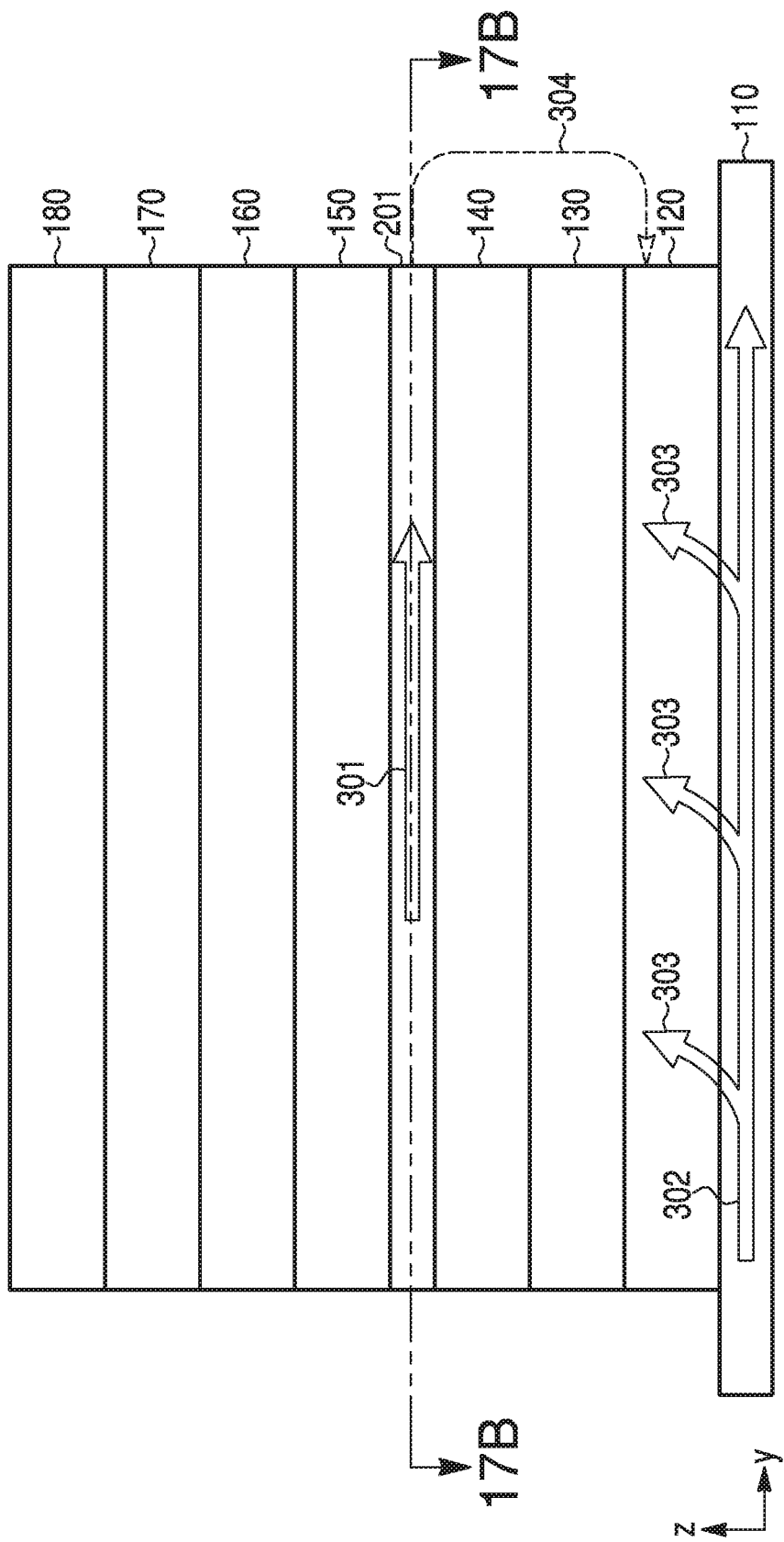
Figure 17B:
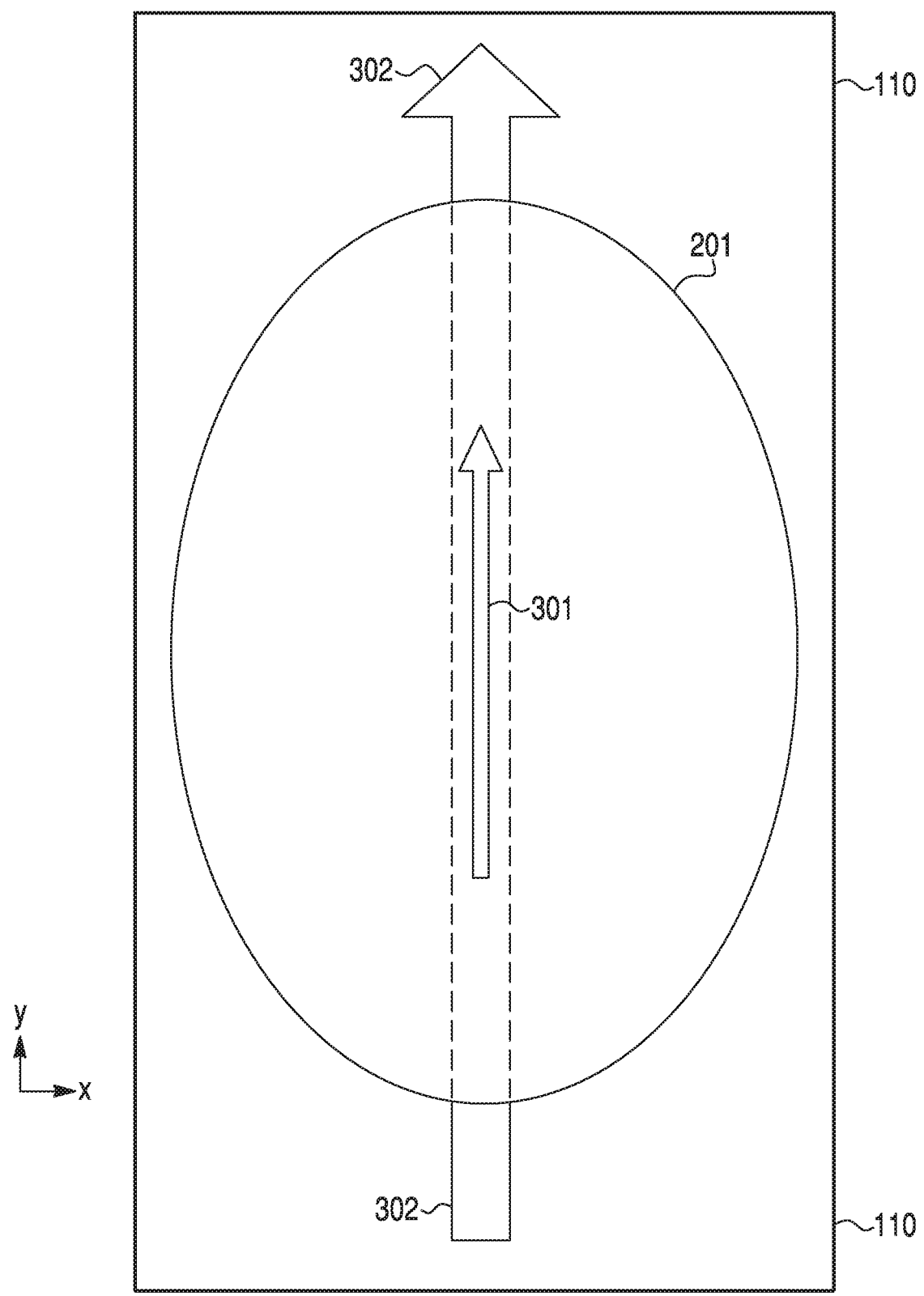
Figure 18:
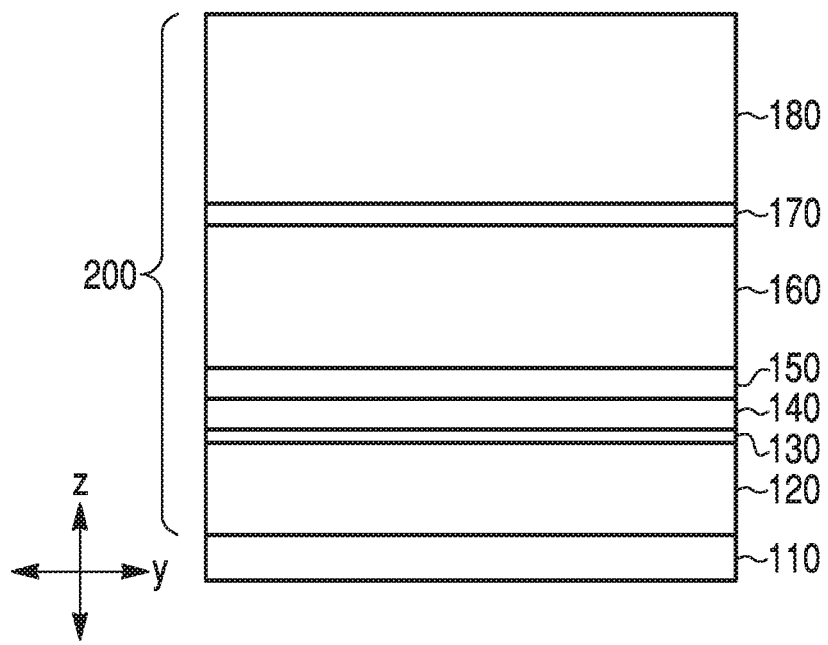
Figure 19:
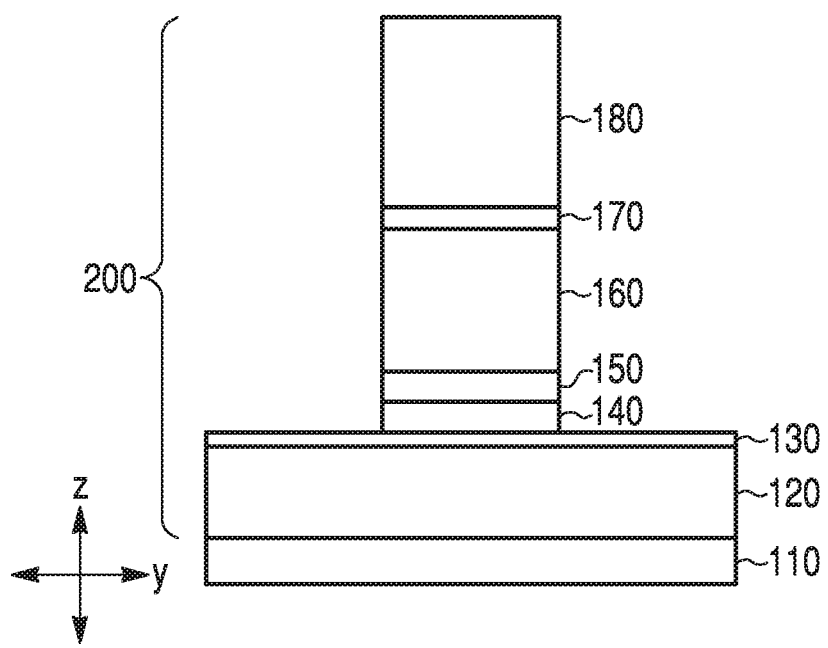
Figure 20:
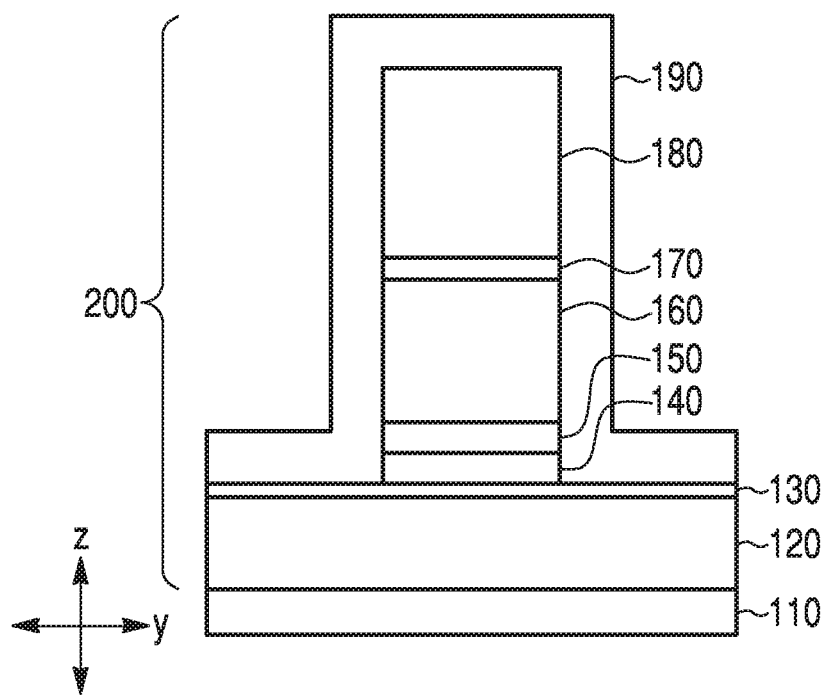
Figure 21:
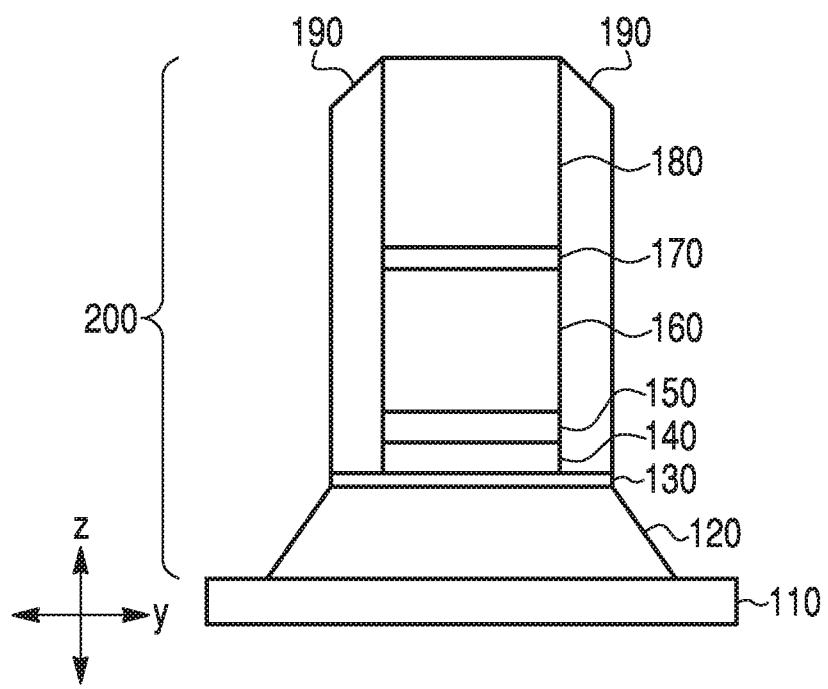
Figure 22A:
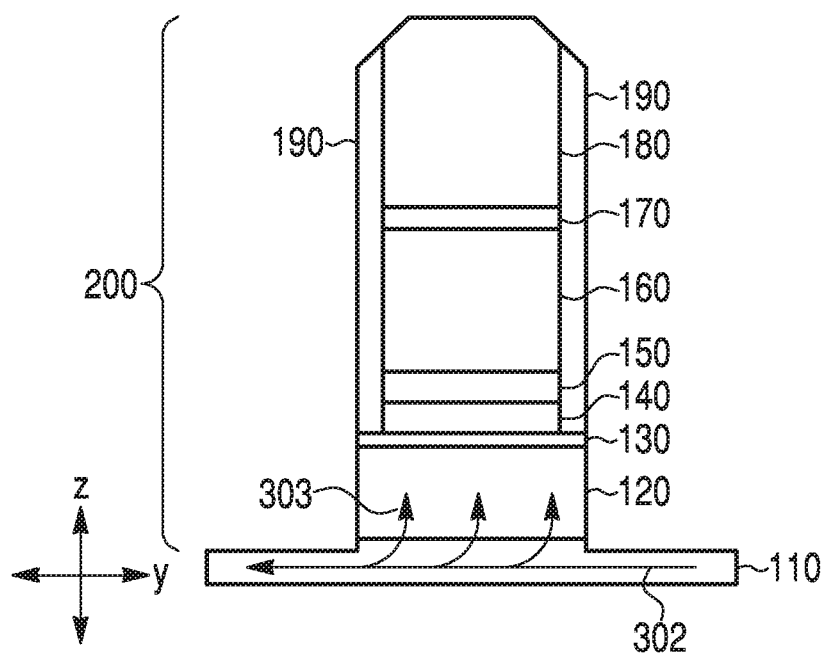
Figure 22B:
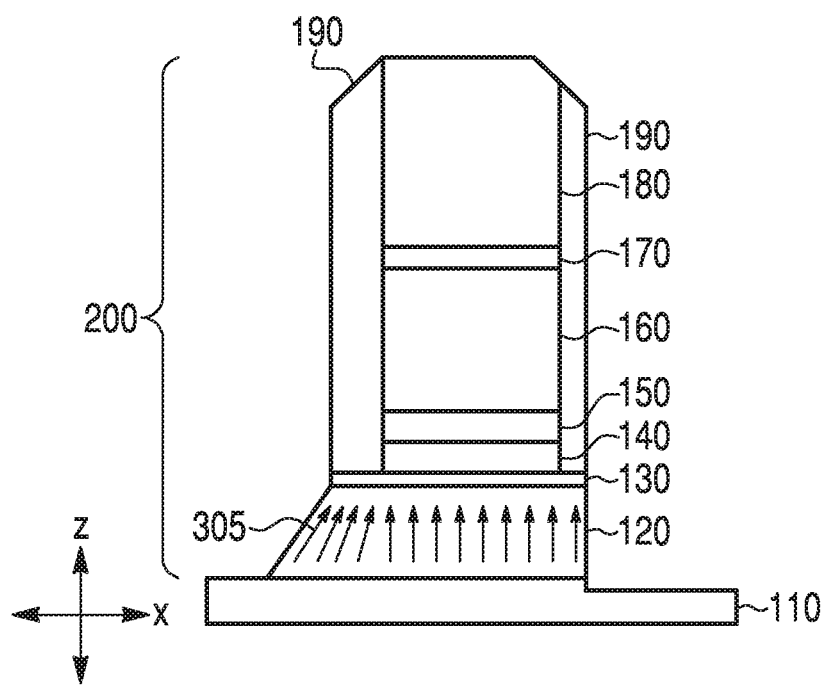
Figure 22C:
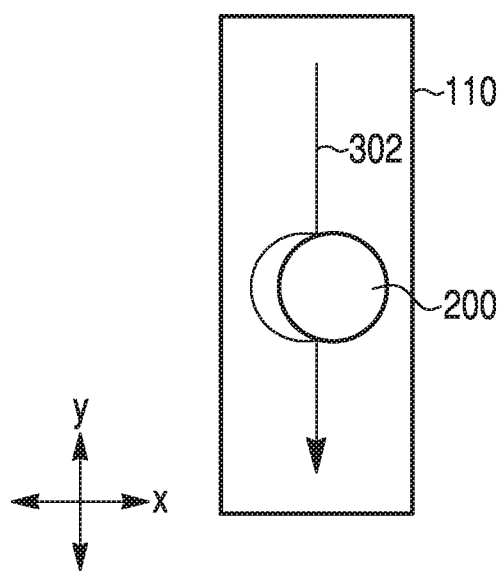
Figure 23:
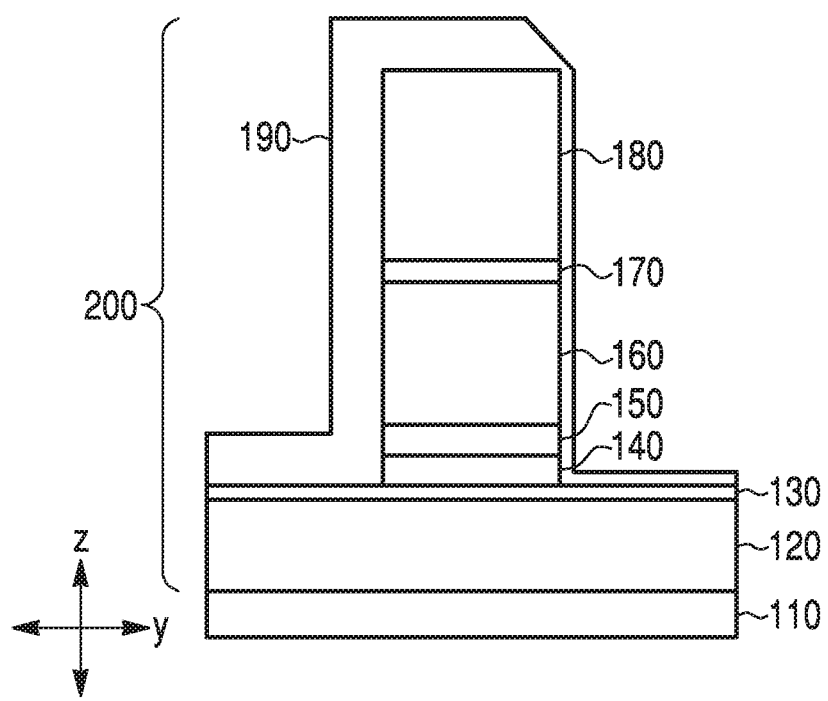
Figure 24A:
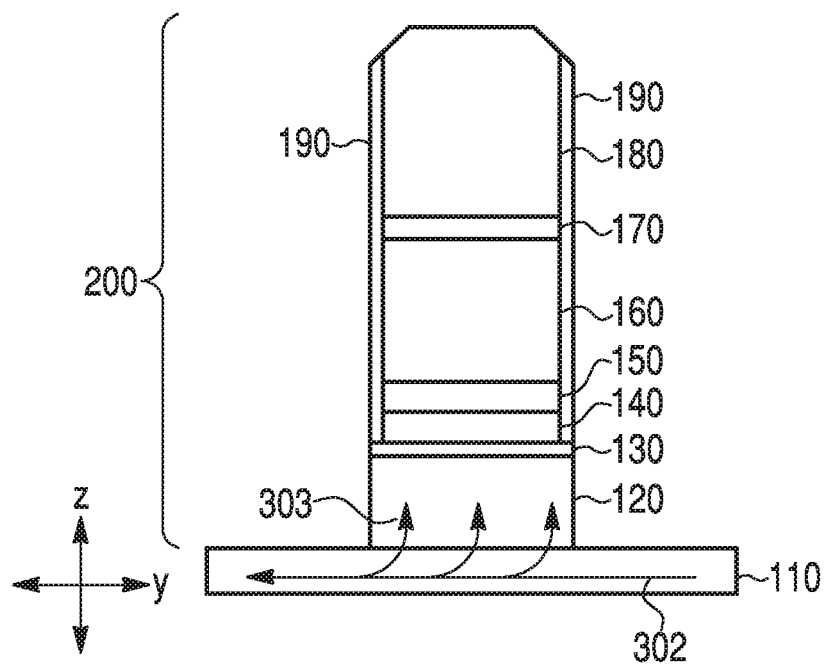
Figure 24B:
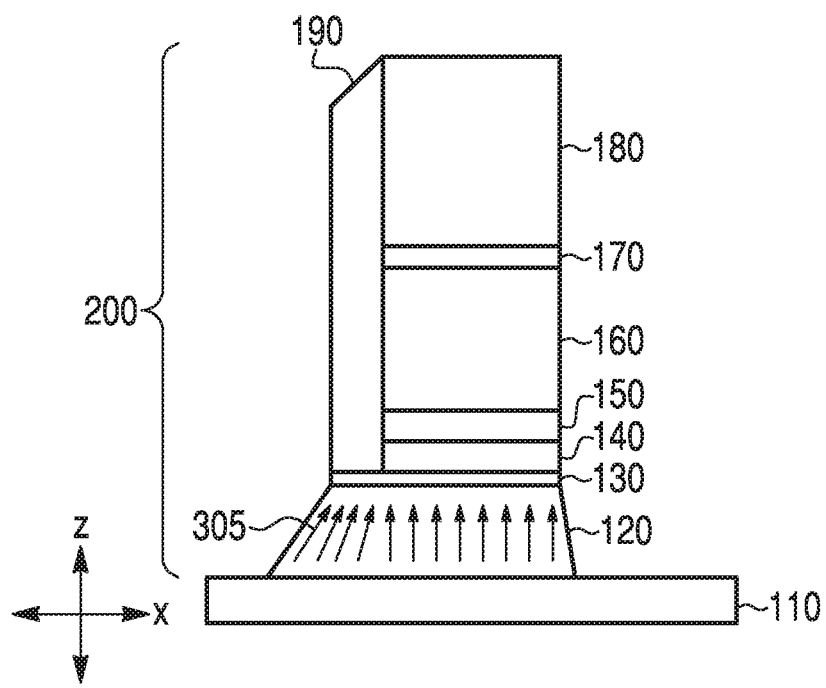
Figure 24C:
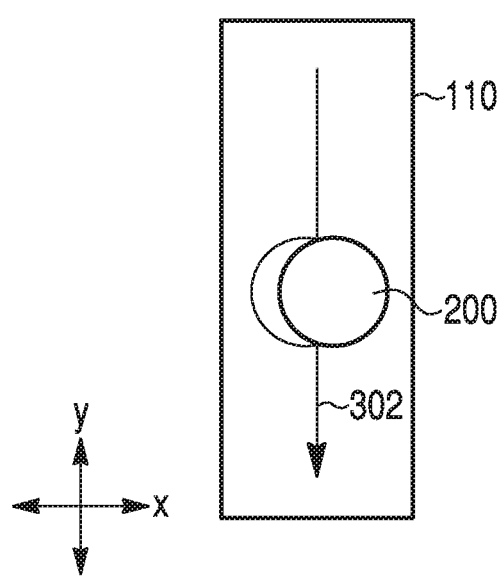
Figure 25:
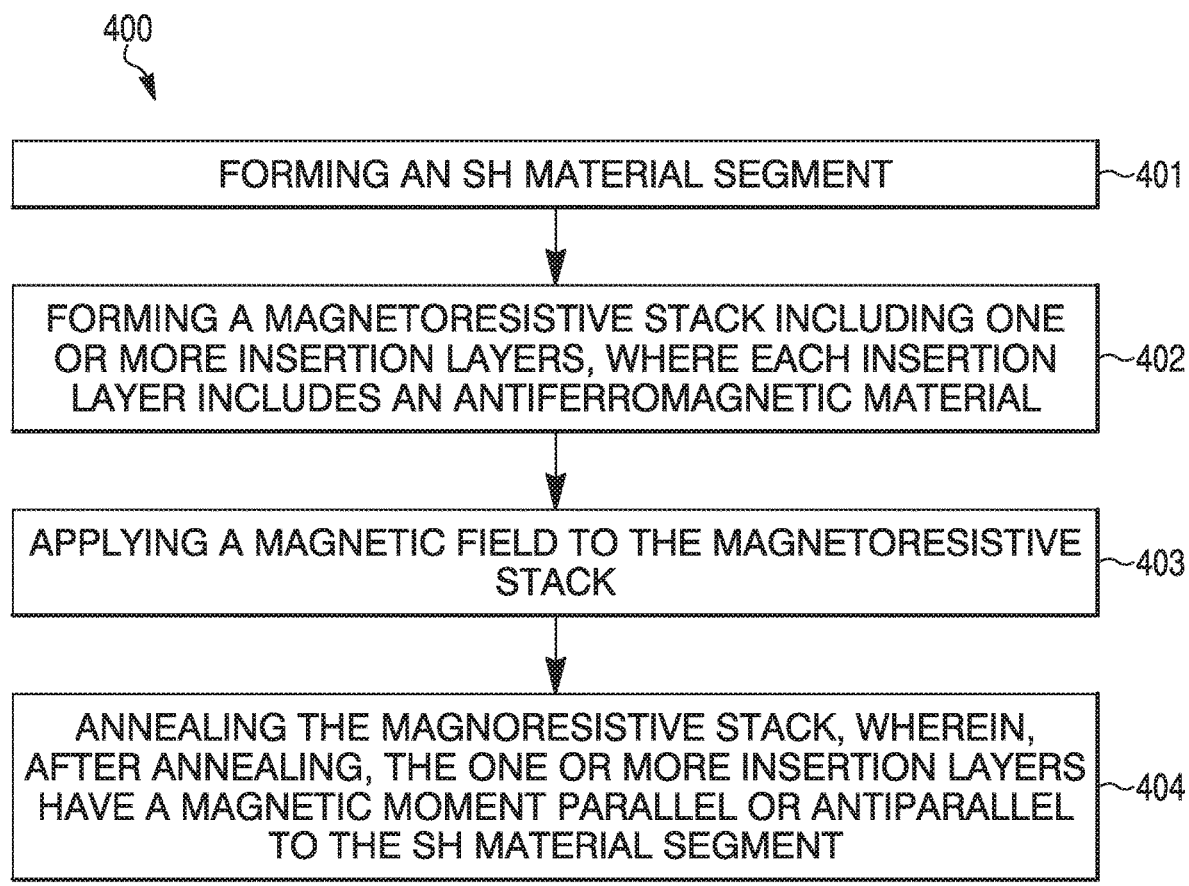
Figure 26:
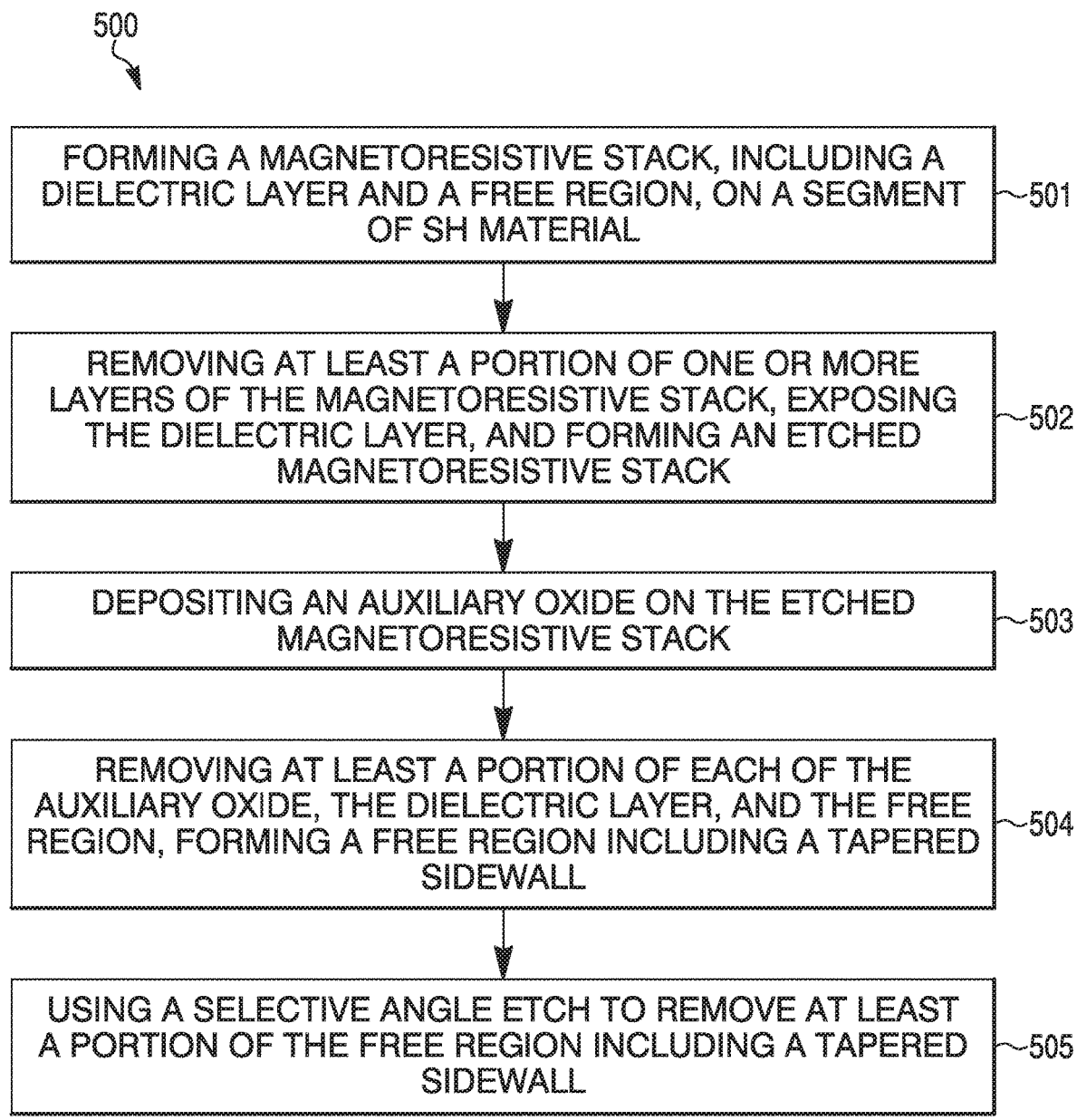
Figure 27:
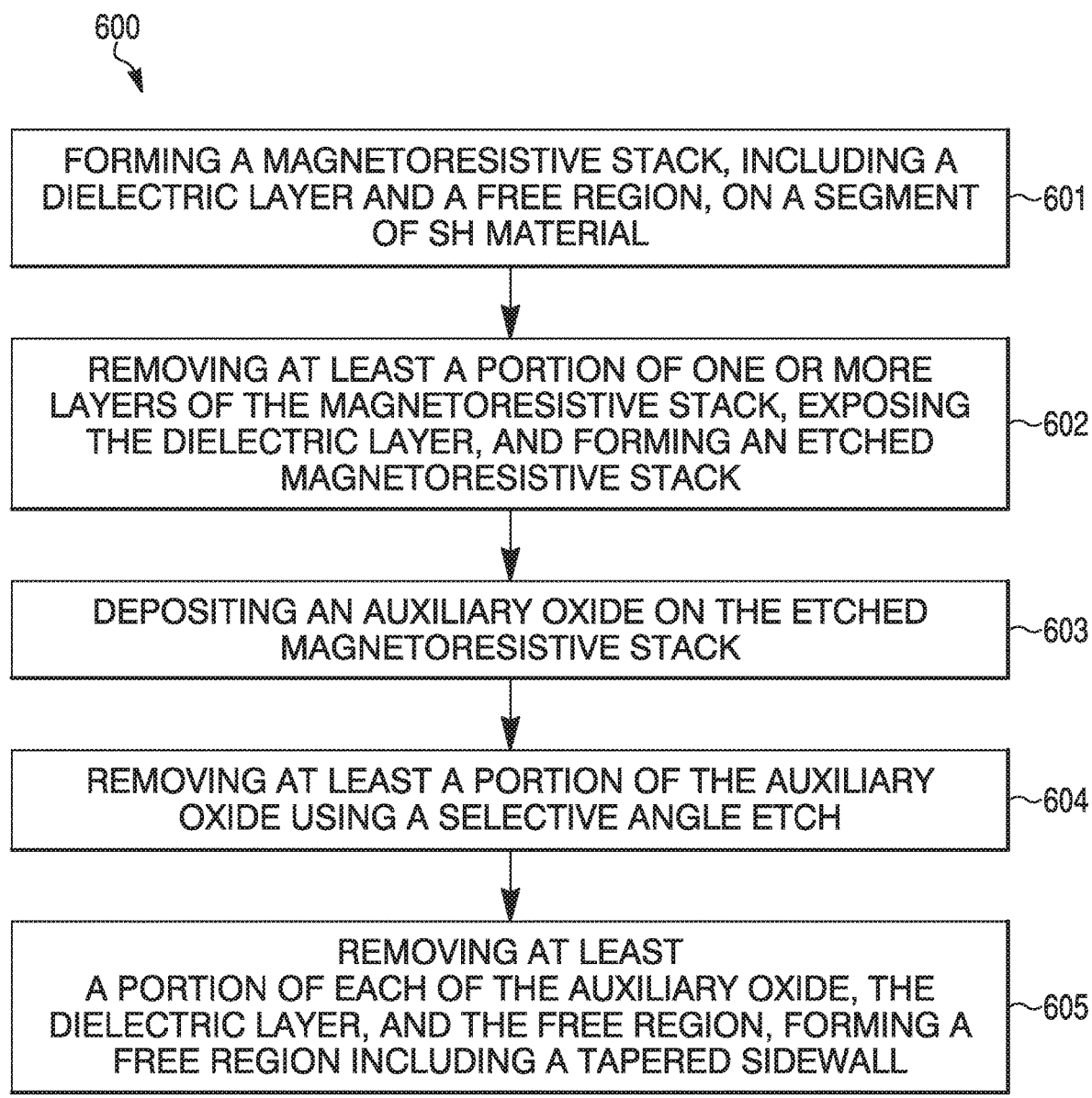
Figure 28:
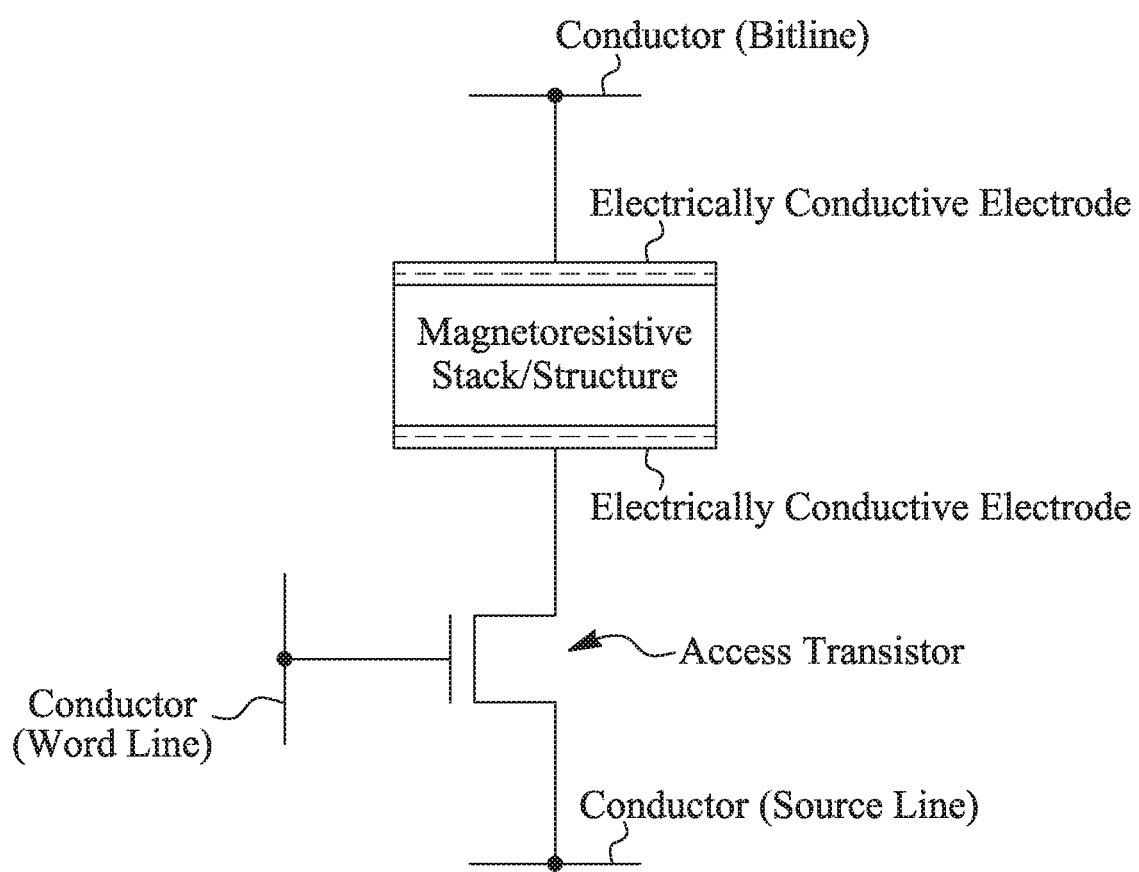
Figure 29A:
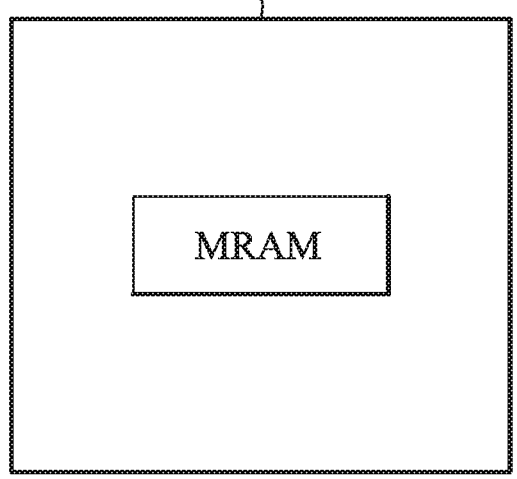
Figure 29B:
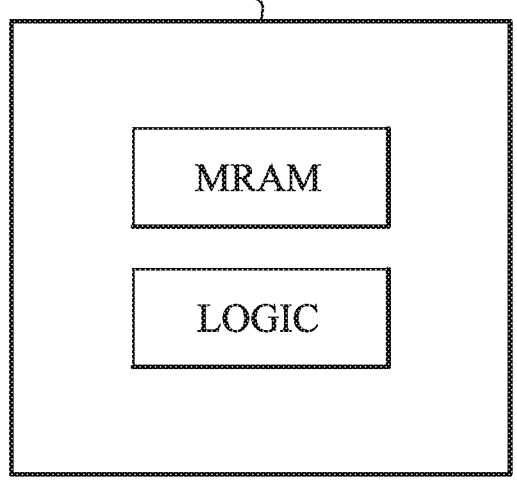

FIGS. 1-16 illustrate a schematic diagram of a region of a magnetoresistive structure utilizing SOT and/or STT switching mechanisms, according to one or more embodiments of the present disclosure;

FIG. 17A illustrates a schematic diagram of a region of a magnetoresistive structure utilizing SOT and/or STT switching mechanisms, according to one or more embodiments of the present disclosure;

FIG. 17B illustrates a top-down view depicting a cross-section of the magnetoresistive structure shown in FIG. 17A, according to one or more embodiments of the present disclosure;

FIG. 18 illustrates a side view depicting a magnetoresistive structure during one stage of manufacture, according to one or more embodiments of the present disclosure;

FIG. 19 illustrates a side view depicting a magnetoresistive structure during one stage of manufacture, according to one or more embodiments of the present disclosure;

FIG. 20 illustrates a side view depicting a magnetoresistive structure during one stage of manufacture, according to one or more embodiments of the present disclosure;

FIG. 21 illustrates a side view depicting a magnetoresistive structure during one stage of manufacture, according to one or more embodiments of the present disclosure;

FIG. 22A illustrates a side view depicting a magnetoresistive structure during one stage of manufacture, according to one or more embodiments of the present disclosure;

FIG. 22B illustrates a perpendicular side view of the magnetoresistive structure shown in FIG. 22A;

FIG. 22C illustrates a top-down view of the magnetoresistive structure shown in FIGS. 22A and 22B;

FIG. 23 illustrates a side view depicting a magnetoresistive structure during one stage of manufacture, according to one or more embodiments of the present disclosure;

FIG. 24A illustrates a side view depicting a magnetoresistive structure during one stage of manufacture, according to one or more embodiments of the present disclosure;

FIG. 24B illustrates a perpendicular side view of the magnetoresistive structure shown in FIG. 24A;

FIG. 24C illustrates a top-down view of the magnetoresistive structure shown in FIGS. 24A and 24B;

FIGS. 25-27 are flow charts illustrating one or more exemplary processes for manufacturing a magnetoresistive structure utilizing SOT and/or STT switching mechanisms;

FIG. 28 is a schematic diagram of an exemplary magnetoresistive memory stack electrically connected to a select device, e.g., an access transistor, in a magnetoresistive memory cell configuration;

FIGS. 29A and 29B are schematic block diagrams of integrated circuits including a discrete memory device and an embedded memory device, each including an MRAM (which, in one embodiments is representative of one or more arrays of MRAM having a plurality of magnetoresistive memory stacks according to aspects of certain embodiments of the present disclosure).

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of 10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of 10% (unless noted otherwise or another variation is specified). Moreover, in the claims, values, limits, and/or ranges of the thickness and atomic composition of, for example, the described layers/regions, mean the value, limit, and/or range 10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials. Embodiments of the present disclosure may be employed in connection with other types of magnetoresistive stacks/structures where such stacks/structures include a fixed magnetic region. For the sake of brevity, the discussions and illustrations presented in this disclosure will not be repeated specifically in the context of GMR or other magnetoresistive stacks/structures (e.g., anisotropic magnetoresistive (AMR) devices), but the discussion and drawings described below are to be interpreted as being entirely applicable to GMR and other magnetoresistive stacks/structures (e.g., AMR-type devices).

In this disclosure, the term "region" may be used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive devices may be referred to by specific names (e.g., bottom electrode, top electrode, fixed magnetic region, free magnetic region), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a free region of a magnetoresistive stack may be depicted as being "above" a spin-Hall (SH) material, in some aspects the entire depicted magnetoresistive structure may be flipped such that the free region is "below" the SH material.

In one exemplary embodiment, a magnetoresistive structure of a magnetoresistive device of the present disclosure may be implemented as a STT and/or SOT MRAM element. In such embodiments, the magnetoresistive structure may include an intermediate layer disposed (e.g., sandwiched) between two ferromagnetic regions to form an MTJ device or an MTJ-type device. Of the two ferromagnetic regions disposed on either side of the intermediate layer, one ferromagnetic region may be a fixed (or pinned) magnetic region, and the other ferromagnetic region may be a free magnetic region. The term free is intended to refer to ferromagnetic regions having a magnetic moment that may shift or move significantly in response to applied magnetic fields or spin-polarized currents used to switch the magnetic moment vector. Relatedly, the words fixed or "pinned" are used to refer to ferromagnetic regions having a magnetic moment vector that does not move substantially in response to such applied magnetic fields or spin-polarized currents. As is known in the art, an electrical resistance of the described magnetoresistive structure may change based on whether the magnetization direction (e.g., the direction of the magnetic moment) of the free region adjacent to the non-magnetic layer (e.g., a tunnel barrier) is in parallel alignment or in an antiparallel alignment with the magnetization direction (e.g., the direction of the magnetic moment) of the fixed region adjacent to the non-magnetic layer. Typically, if the two regions have the same magnetization alignment, the resulting relatively low resistance is considered as a digital "0," while if the alignment is antiparallel the resulting relatively higher resistance is considered to be a digital "1." A memory device (e.g., an MRAM) may include multiple magnetoresistive structures/stacks, which may be referred to as memory cells or elements, arranged in an array of columns and rows. By measuring the current through each cell, the resistance of each cell, and thus the data stored in the memory array can be read.

In some embodiments, the free magnetic region and the fixed magnetic region may each include a plurality of the layer(s) of magnetic or ferromagnetic materials, For example, materials that include one or more of the ferromagnetic elements nickel (Ni), iron (Fe), and cobalt (Co), including, for example, alloys or engineered materials with one or more of the elements palladium (Pd), platinum (Pt), magnesium (Mg), manganese (Mn), and chromium (Cr), boron (B)) as well as one or more synthetic antiferromagnetic structures (SAF) or synthetic ferromagnetic structures (SyF) wherein one or more layers of magnetic materials layers may also include one or more non-magnetic materials layers (for example, ruthenium (Ru), copper (Cu), aluminum (Al), tantalum (Ta), titanium (Ti), niobium (Nb), vanadium (V), zirconium (Zr), iridium (Ir) and one or more alloys thereof, and in certain embodiments, tungsten (W) and molybdenum (Mo). An intermediate layer (e.g., a dielectric layer) may be, for example, one or more layers of aluminum oxide and/or magnesium oxide.

In a magnetoresistive device utilizing SOT switching mechanics, switching the magnetization of the free region of a magnetoresistive stack may be accomplished, or assisted, by driving a current pulse through a SH material proximate (e.g., in contact with or near) the free region. Examples of SH materials include, but are not limited to, platinum (Pt), beta-tungsten (β-W), tantalum (Ta), palladium (Pd), hafnium (Hf), gold (Au), alloys including gold (e.g., AuPt, AuCu, AuW), alloys including bismuth (Bi) and selenium (Se) (e.g., $Bi_2Se_3$ or $(BiSe)_2Te_3$), alloys including copper (Cu) and one or more of platinum (Pt), bismuth (Bi), iridium (Ir), or lead (Pb) (e.g., CuPt alloys, CuBi alloys, CuIr alloys, CuPb alloys), alloys including silver (Ag) and bismuth (Bi) (e.g., AgBi alloys), alloys including manganese (Mn) and one or more of platinum (Pt), iridium (Ir), palladium (Pd), or iron (Fe) (e.g., PtMn alloys, IrMn alloys, PdMn alloys, FeMn alloys), or combinations thereof.

The mean current required to be passed through a free region in order to change its magnetic state may be referred to as the critical current (Ic). The critical current is indicative of the current required to "write" data in a magnetoresistive memory cell. Reducing the critical current is desirable so that, among other things, a smaller access transistor can be used for each memory cell and that a higher density, lower cost memory can be produced. A reduced critical current may also lead to greater longevity and/or durability of a magnetoresistive memory cell.

Embodiments described herein may utilize what may be referred to as spin current to switch or aid in switching the magnetic state of the free region in an MTJ or MTJ-like device. Current through an SH material adjacent to (and/or in contact with) the free region results in a spin torque acting on the free region due to the injection of a spin current into the free region from the spin-dependent scattering of electrons in the SH material. The polarity of the current through the SH material and the polarity of the SH material itself may determine the direction in which the spin current is imparted. The spin current is injected into the free region in a direction perpendicular to the boundary (or interface) where the free region and the SH material meet, and orthogonal to the direction of the current flow. The spin torque applied to the free region by the spin current impacts the magnetic state of the free region in a manner similar to spin-polarized tunneling current that flows through the MTJ in traditional STT magnetic tunnel junctions. As the function of STT magnetic tunnel junctions is well known in the art, it will not be further described here.

As with write currents in conventional STT MTJ devices, in devices using SOT switching mechanisms, the direction of torque applied by the spin current is dependent on the direction of the current flow in the SH material. In other words, the direction of current flow within the SH material proximate to the free region determines the direction of torque that is applied to the free region. Accordingly, the free region may be able to be switched between two stable states based on torque applied by current flowing in the proximate SH material in one direction or the other. In some embodiments, the free region may be able to be switched between two stable magnetic states based on the torque applied by a STT current flowing in either direction through the MTJ. The magnetic state of the free region may also be switching by the torque resulting from both an STT current by applying an electrical current through MTJ bit and the spin torque by a spin current injected from one or more SH materials by applying an electrical current through one or more SH materials.

In some embodiments, the torque applied by the spin current (i.e., SOT current) alone is used to switch the free region into a particular magnetic state, whereas in other embodiments, the spin current works as an "assist" to reduce the magnitude of an STT write current required to switch the magnetic state of the free region, where the STT write current travels through the entirety of the MTJ stack to produce a spin polarized tunneling current between the free region and fixed region. Reading of data stored by the MTJ stack is accomplished as in a conventional STT MTJ device. For example, a read current, having a magnitude less than that of the critical current of the MTJ stack, is applied to the MTJ stack to sense the resistance of the MTJ stack. As a person of ordinary skill in the art would recognize, there are many techniques that may be used to detect or sense the resistance of the MTJ stack. In some embodiments, the resistance sensed based on the read current can be compared with a reference resistance to determine the state of the free region. In some embodiments, a self-referenced read operation is performed where the resistance through the MTJ is sensed, then the MTJ is written (or reset) so that the free region is in a known state, then the resistance is sensed again and compared with the resistance originally sense. The original state of the free region can then be determined based on whether the resistance sense has changed based on the write or reset operation. In still other embodiments, a mid-point reference read operation may be performed.

For the sake of brevity, conventional techniques related to semiconductor processing may not be described in detail herein. The exemplary embodiments may be fabricated using known lithographic processes. The fabrication of integrated circuits, microelectronic devices, microelectric mechanical devices, microfluidic devices, and photonic devices involves the creation of several layers or regions (e.g., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of the developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack having one or more electrically conductive electrodes, vias, or conductors on either side of a magnetic material stack. As described in further detail below, the magnetic material stack may include many different regions of material, where some of these regions include magnetic materials, whereas others do not. In one embodiment, the methods of manufacturing include sequentially depositing, growing, sputtering, evaporating, and/or providing (which may be referred to collectively herein as "depositing") regions which after further processing (e.g., etching) form a magnetoresistive stack.

In some embodiments, the disclosed magnetoresistive stacks may be formed between a top electrode/via/line and a bottom electrode/via/line and which permit access to the stack by allowing for connectivity (e.g., electrical) to circuitry and other elements of the magnetoresistive device. Between the electrodes/vias/lines are multiple regions, including at least one fixed magnetic region (which may be referred to hereinafter as a fixed region) and at least one free magnetic region (which may be referred to hereinafter as a free region) with one or more intermediate layers (e.g., a dielectric layer) that forms a tunnel barrier between the fixed region and the free region. Each of the fixed region and the free region may include, among other things, a plurality of ferromagnetic layers. In some embodiments, the fixed region (e.g., fixed region 160 discussed below) may include a synthetic antiferromagnet (SAF). In some embodiments, a top electrode (and/or) bottom electrode may be eliminated and a bit line and/or SH material may be formed on top of the stack. Additionally, each magnetoresistive stack may be disposed proximate to an SH material. The SH material may be configured to carry current and impart spin current on the free region during write and reset operations. In one or more embodiments, one or more electrodes of a magnetoresistive stack may include an SH material. In other embodiments, a magnetoresistive stack may be formed between a top electrode and a bottom electrode and proximate to an SH material, the SH material being independently connected to a current source. In such embodiments, the magnetoresistive structure or device may be referred to as a three-terminal magnetoresistive device.

According to one or more embodiments, a magnetoresistive structure may include a reference layer, a transition layer, and/or a cap region. For example, a transition layer may facilitate, promote, or otherwise assist the formation of a reference layer above the intermediate layer (e.g., a dielectric layer) without deleterious affecting the properties of the reference layer or intermediate layer. Transition layer may include a non-ferromagnetic transition metal, such as, for example, tantalum (Ta), titanium (Ti), tungsten (W), molybdenum (Mo), or combinations and alloys thereof.

Reference layer may include one or more layers of material that, among other things, facilitate and improve the growth of one or more overlying regions (e.g., a fixed region including a SAF) during manufacture of magnetoresistive structure 100. The reference layer may include, e.g., cobalt (Co), iron (Fe), and boron (B), such as a cobalt-iron-boron alloy (CoFeB), a cobalt-iron-boron-tantalum allow (CoFeBTa), a cobalt-iron-tantalum alloy (CoFeTa), or combinations thereof. In some embodiments, reference layer may include one or more alloys that include iron (Fe), cobalt (Co) or nickel (Ni), and other relatively electronegative elements (e.g., elements with an electronegativity greater than the electronegativity of iron (Fe)). For example, the reference layer may include one or more alloys, such as, for example, an alloy having the formula XY, where X is selected from a list comprising: cobalt (Co), iron (Fe), nickel (Ni), cobalt-iron (CoFe), iron-nickel (FeNi), and cobalt-nickel (CoNi), and Y is selected from a list comprising: silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), and carbon (C). Inclusion in the alloy of one or more elements, that have an electronegativity greater than the electronegativity of iron (Fe) (e.g., silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), carbon (C)).

Referring now to FIGS. 1-16, various magnetoresistive structures (e.g., the relative location and orientation of the free region, the intermediate layer, the fixed region, one or more SH materials, and/or one or more other layers or regions) are shown. The simplified illustrations in FIGS. 1-16 do not necessarily show all regions and layers of an exemplary magnetoresistive structure, but instead are intended to illustrate the relative location and positioning of several exemplary regions. Further, although the regions depicted in FIGS. 1-16 are rectangular in shape, this is for simplicity and clarity only. The magnetoresistive structures described herein may have a rectangular, trapezoidal, pyramidal, cylindrical, or other shape.

Still referring to FIGS. 1-16, a magnetoresistive structure 100 may include one or more regions or layers between a line, strip, or region of SH material 110 and a top electrode 180. For example, referring to FIG. 1, a free region 120, may be disposed on and in contact with SH material 110. An intermediate layer 130 may be disposed on and in contact with free region 120. A fixed region 160 may be disposed on the other side of intermediate layer 130 from free region 120. In some embodiments, fixed region 160 may be disposed on and in contact with intermediate layer 130. The magnetoresistive structure 100, may include one or more additional regions or layers, such as, for example, a cap region 170. Cap region 170 may be disposed above and in contact with fixed region 160. Top electrode 180 may be disposed above fixed region 160, such as, for example, disposed above and in contact with cap region 170.

Referring again to FIGS. 1-16, for read operations, current may pass from SH material 110, through the magnetoresistive structure 100, to top electrode 180. For write and/or reset operations, current may pass along SH material 110, imparting spin current to free region 120. In addition, a write current may also be passed from SH material 110, through the magnetoresistive structure 100, to top electrode 180, to assist in switching the magnetic state of free region 120.

According to one or more embodiments, a magnetoresistive structure 100 may include one or more insertion layers adjacent to cap region 170 and/or transition layer 150. Each of the one or more insertion layers may include one or more layers of antiferromagnetic (AFM) material such as platinum-manganese (PtMn) alloys, iridium-manganese (IrMn) alloys, iron-manganese (FeMn) alloys, chromium (Cr), and/or combinations thereof. In embodiments where a magnetoresistive structure 100 includes more than one insertion layer, the composition of one insertion layer may be the same as the composition of another insertion layer and/or the composition of one insertion layer may be different than at least one other insertion layer.

Figure 1:
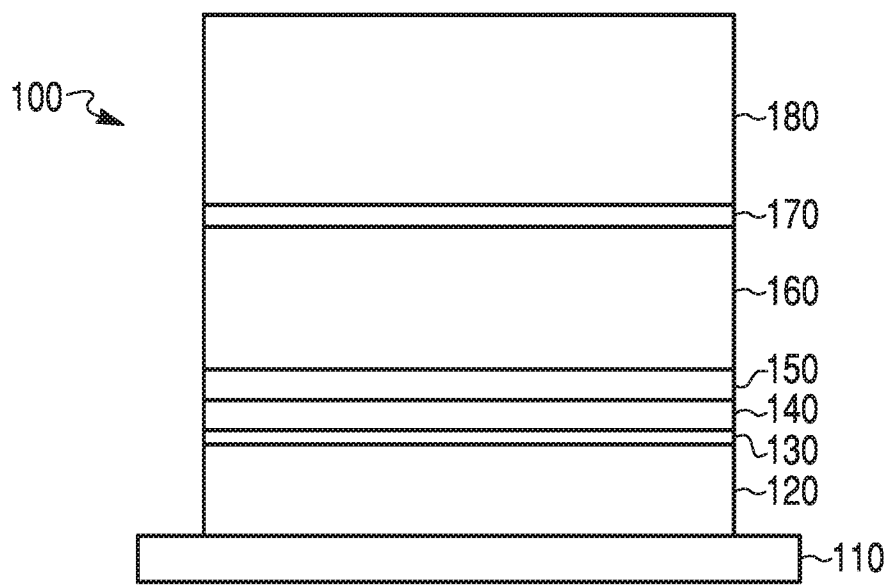
Figure 2:
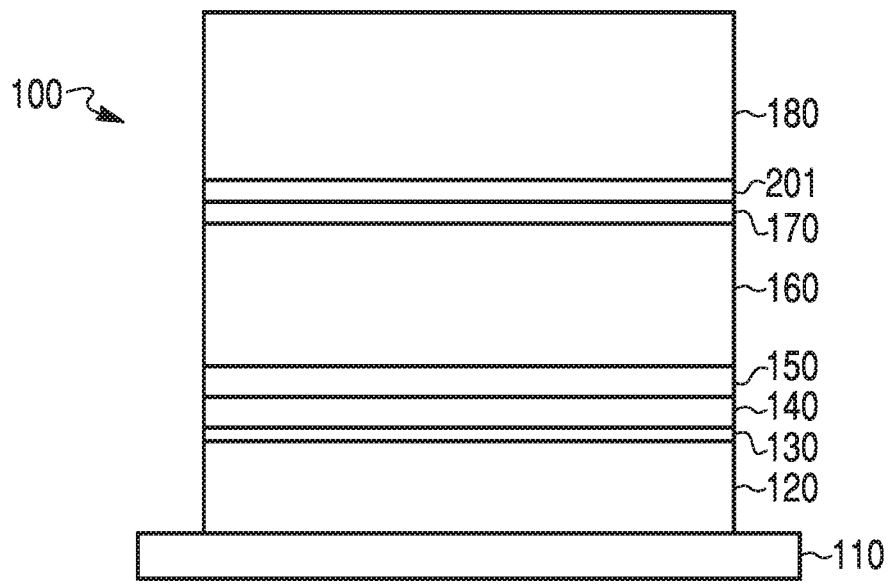
Figure 3:
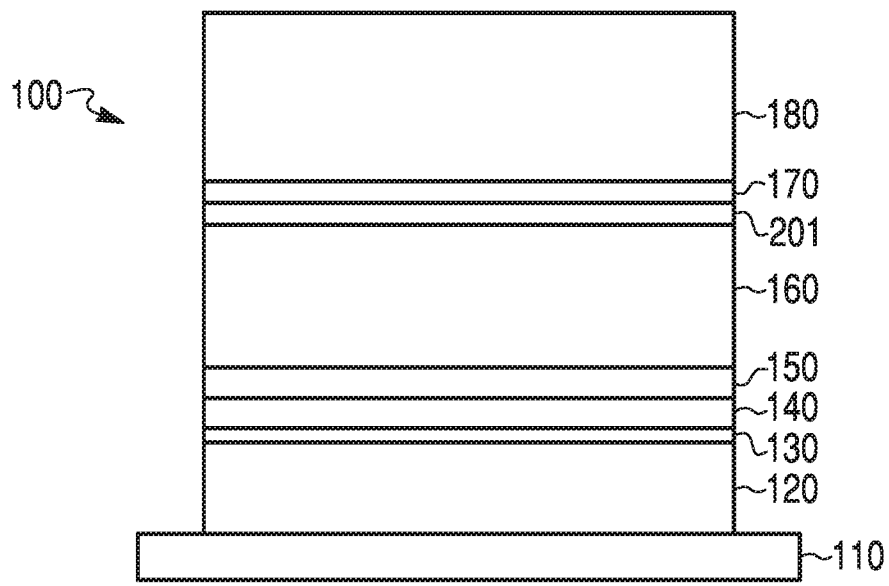
Figure 4:
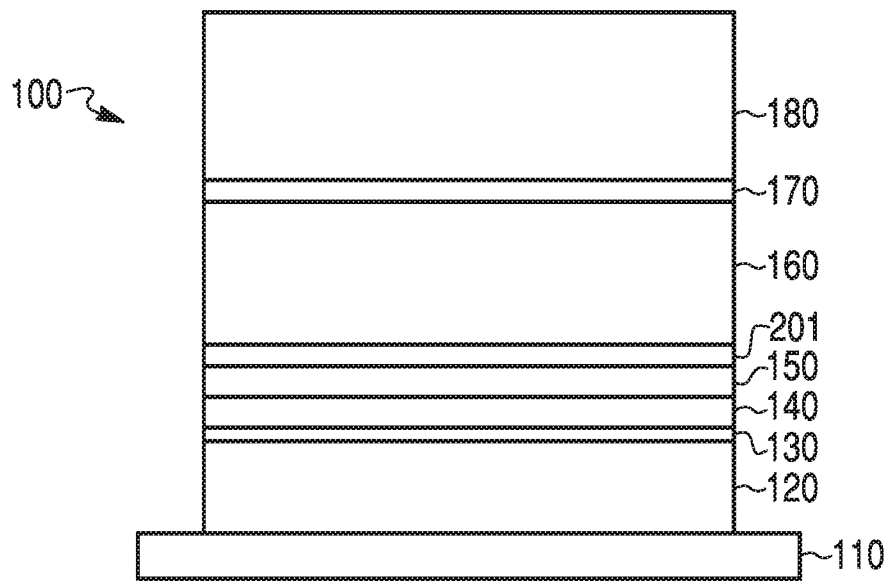
Figure 5:
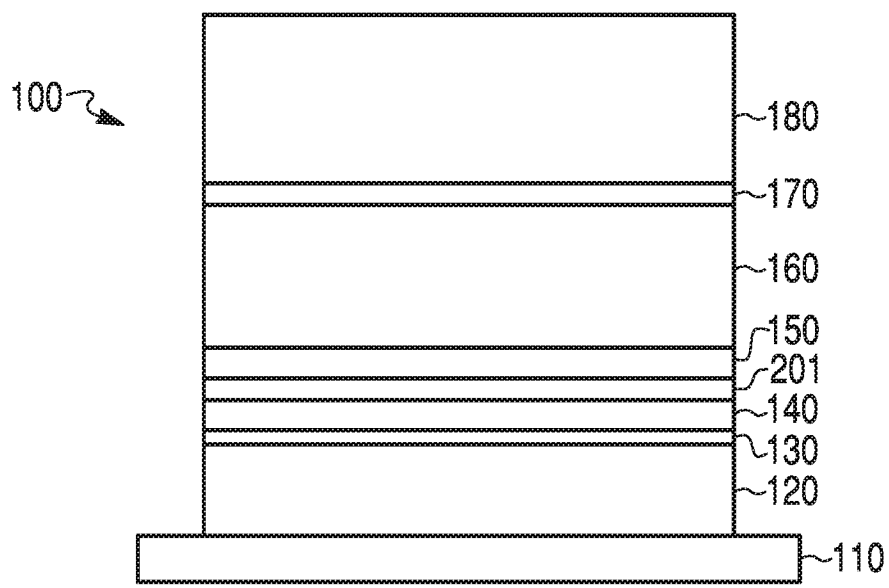

Referring to FIGS. 2-5, magnetoresistive structure 100 may include an insertion layer 201 disposed between reference layer 140 and top electrode 180. For example, referring to FIG. 2, magnetoresistive structure 100 may include an insertion layer 201 disposed between cap region 170 and top electrode 180. In some embodiments, such as the embodiment shown in FIG. 3, magnetoresistive structure 100 may include an insertion layer 201 disposed between fixed region 160 and cap region 170. Referring to FIG. 4, magnetoresistive structure 100 may include an insertion layer 201 disposed between transition layer 150 and fixed region 160. In addition or alternatively, magnetoresistive structure 100 may include an insertion layer 201 disposed between reference layer 140 and transition layer 150, as shown in FIG. 5.

Insertion layer 201 may have a thickness less than or equal to approximately 2 nanometers (nm), such as for example, less than or equal to approximately 1.5 nm, less than or equal to approximately 1 nm, approximately 1 nm to approximately 2 nm, approximately 1 nm to approximately 1.5 nm, approximately 0.5 nm to approximately 1.5 nm, approximately 0.5 nm to approximately 1.0 nm, approximately 0.7 nm, approximately 0.5 nm, or any other suitable thickness that does not deleteriously affect the bidirectional transfer of current from SH material 110 to top electrode 180.

Referring to FIGS. 6-11, a magnetoresistive structure 100 may include a first insertion layer 201 and a second insertion layer 202. As described above, the terms "first," "second," and the like, herein do not denote any order, quantity, or importance, but rather are used to distinguish one element from another. First insertion layer 201 may have the same composition as second insertion layer 202, or the insertion layers 201, 202 may have different compositions. Second insertion layer 202 may have a similar thickness as first insertion layer 201, described above. In some embodiments, second insertion layer 202 may have a thickness less than a thickness of first insertion layer 201. In other embodiments, second insertion layer 202 may have a thickness greater than a thickness of first insertion layer 201.

Figure 6:
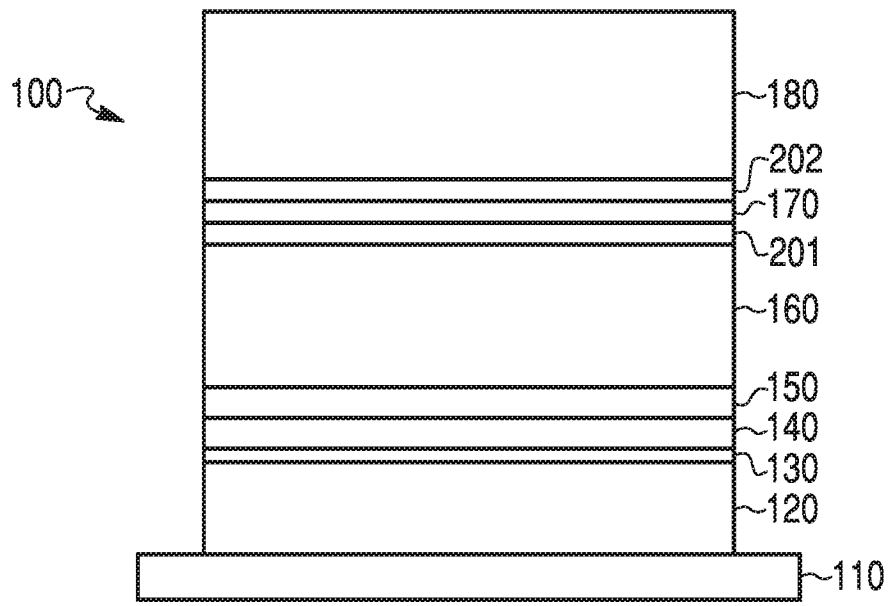
Figure 7:
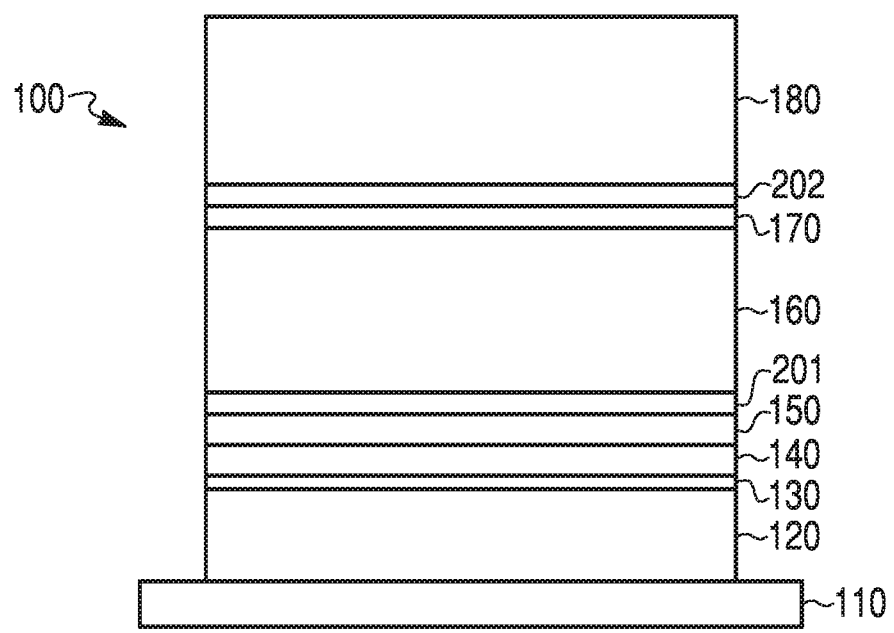
Figure 8:
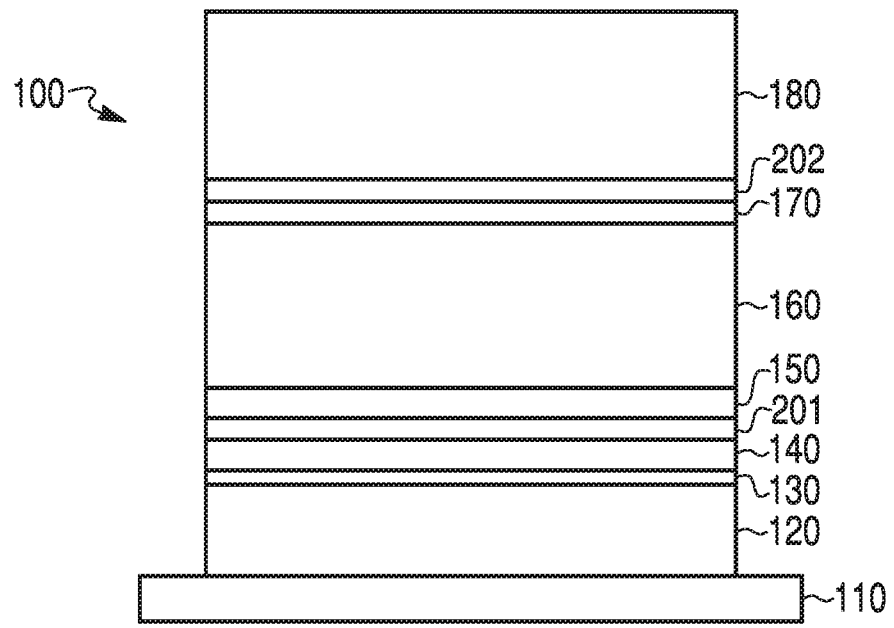
Figure 9:
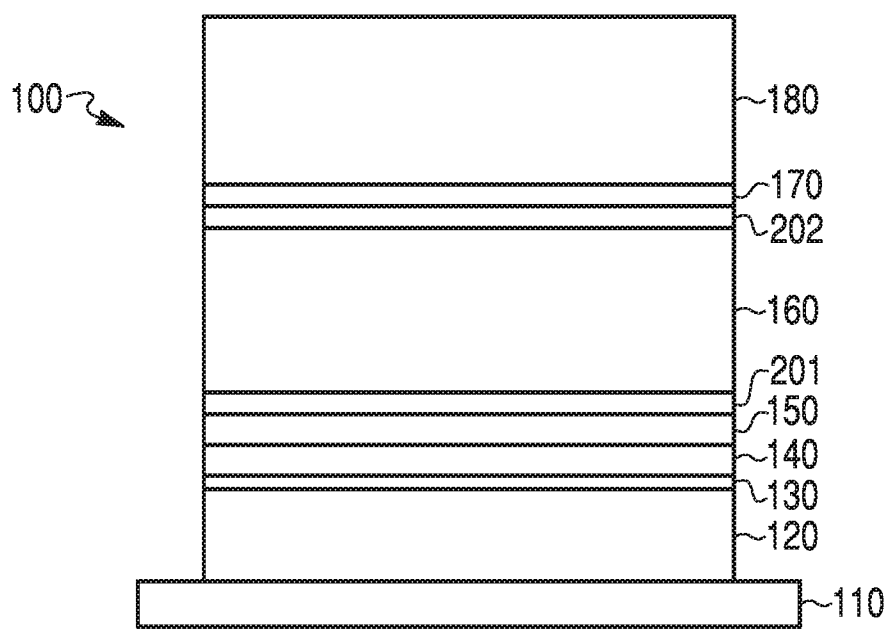
Figure 10:
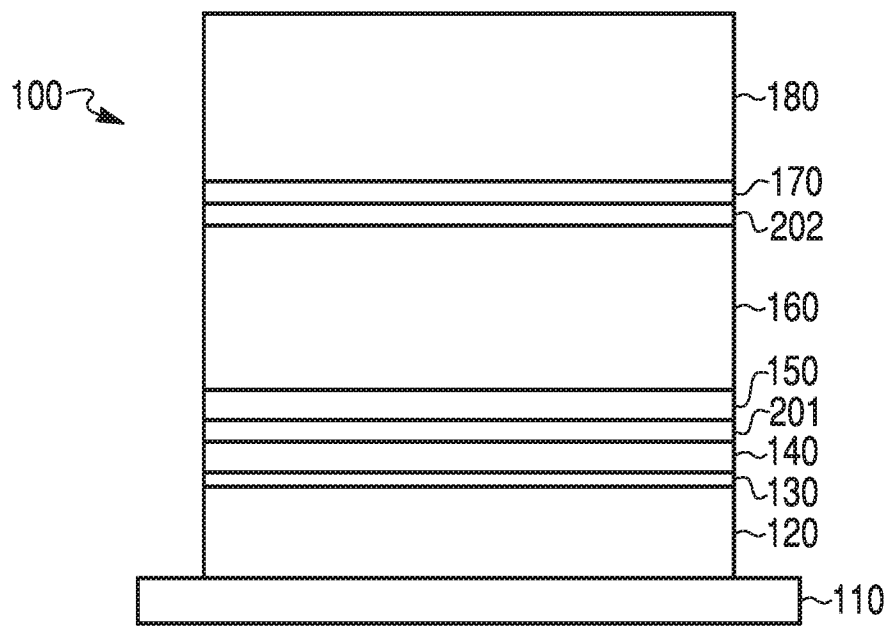
Figure 11:
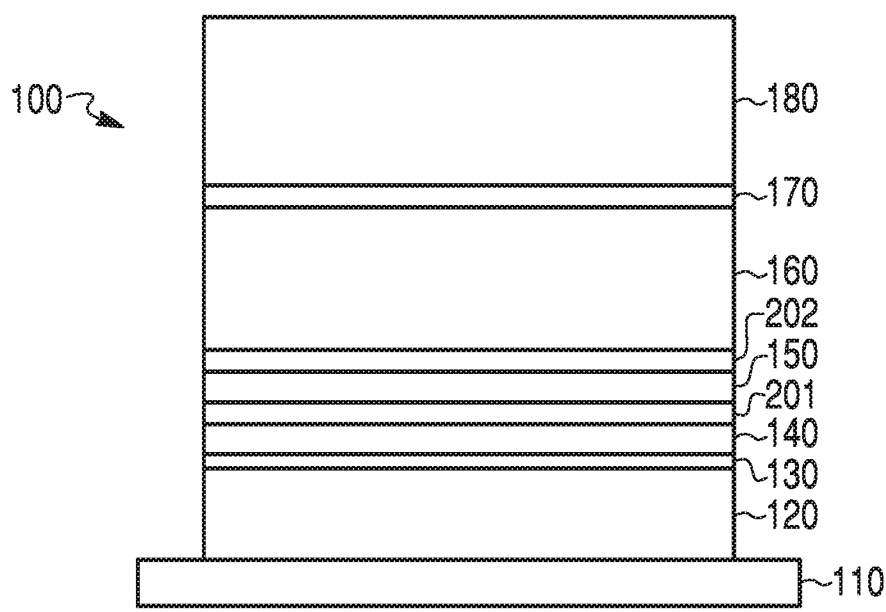

For example, referring to FIG. 6, a magnetoresistive structure 100 may include a first insertion layer 201, disposed between fixed region 160 and cap region 170, and a second insertion layer 202, disposed between cap region 170 and top electrode 180. In some embodiments, such as the embodiment shown in FIG. 7, a magnetoresistive structure 100 may include a first insertion layer 201, disposed between transition layer 150 and fixed region 160, and a second insertion layer 202, disposed between cap region 170 and top electrode 180. Referring to FIG. 8, a magnetoresistive structure 100 may include a first insertion layer 201, disposed between reference layer 140 and transition layer 150, and a second insertion layer 202, disposed between cap region 170 and top electrode 180. In some embodiments, magnetoresistive structure 100 may include a first insertion layer 201, disposed between transition layer 150 and fixed region 160, and a second insertion layer 202, disposed between fixed region 160 and cap region 170, as shown in FIG. 9. Referring to FIG. 10, a magnetoresistive structure 100 may include a first insertion layer 201 disposed between reference layer 140 and transition layer 150, and a second insertion layer 202 disposed between fixed region 160 and cap region 170. In addition or alternatively, magnetoresistive structure 100 may include a first insertion layer 201 disposed between reference layer 140 and transition layer 150, and a second insertion layer 202 disposed between transition layer 150 and fixed region 160, as shown in FIG. 11.

Referring to FIGS. 12-15, a magnetoresistive structure 100 may include a first insertion layer 201, a second insertion layer 202, and a third insertion layer 203. First insertion layer 201 may have the same composition as second insertion layer 202 and third insertion layer 203, or one or more insertion layers 201, 202, 203 may have a different composition than at least one other insertion layer 201, 202, 203. Third insertion layer 203 may have a similar thickness as first insertion layer 201 or second insertion layer 202, as described above. In some embodiments, third insertion layer 203 may have a thickness less than a thickness of first insertion layer 201 and/or second insertion layer 202. In addition or alternatively, third insertion layer 203 may have a thickness greater than a thickness of first insertion layer 201 and/or second insertion layer 202.

Figure 12:
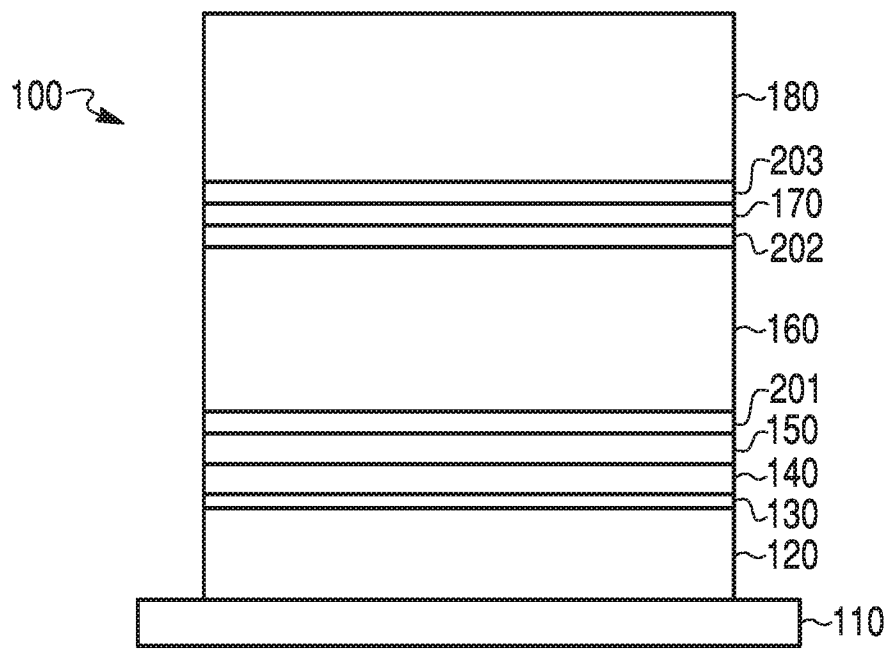
Figure 13:
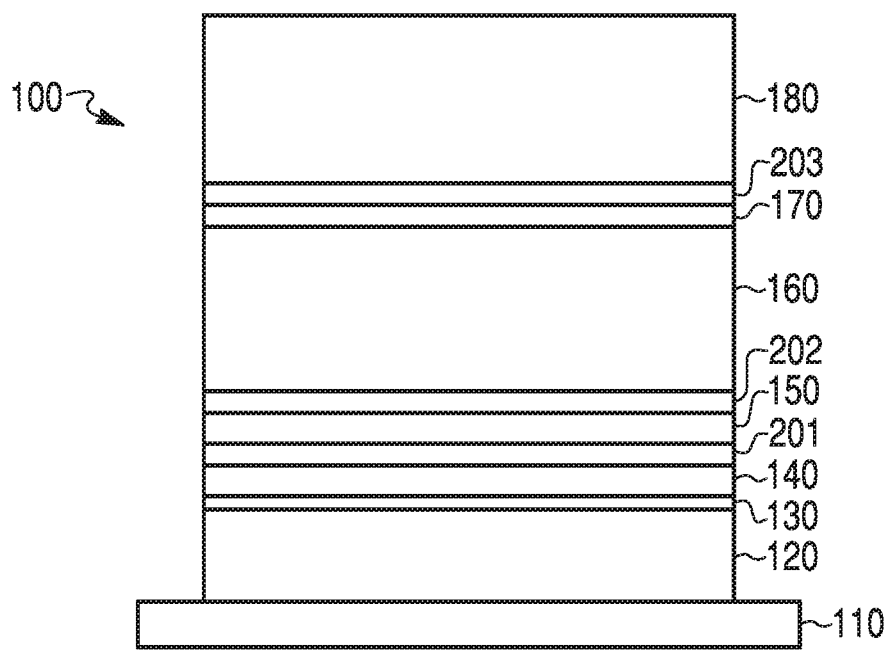
Figure 14:
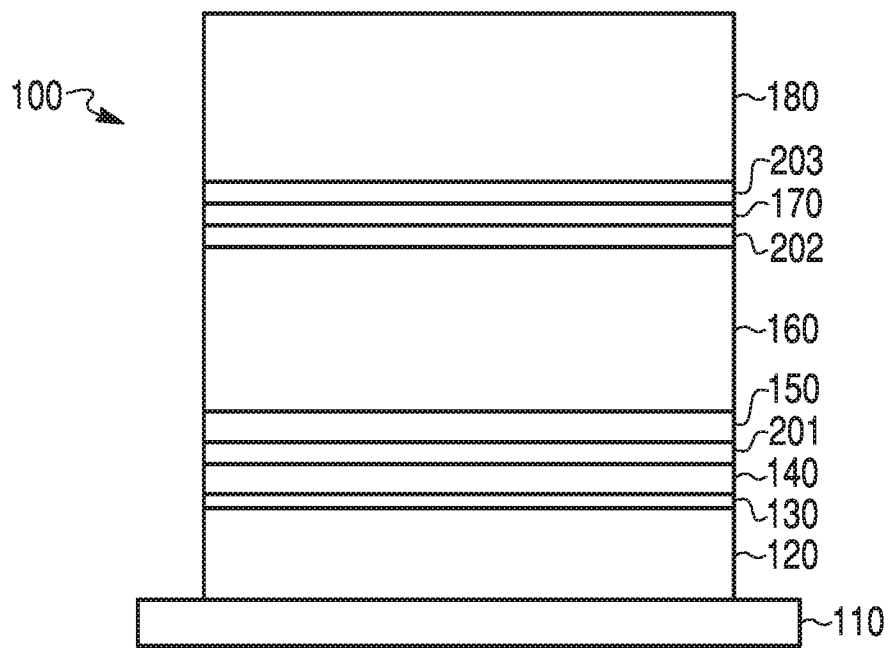
Figure 15:
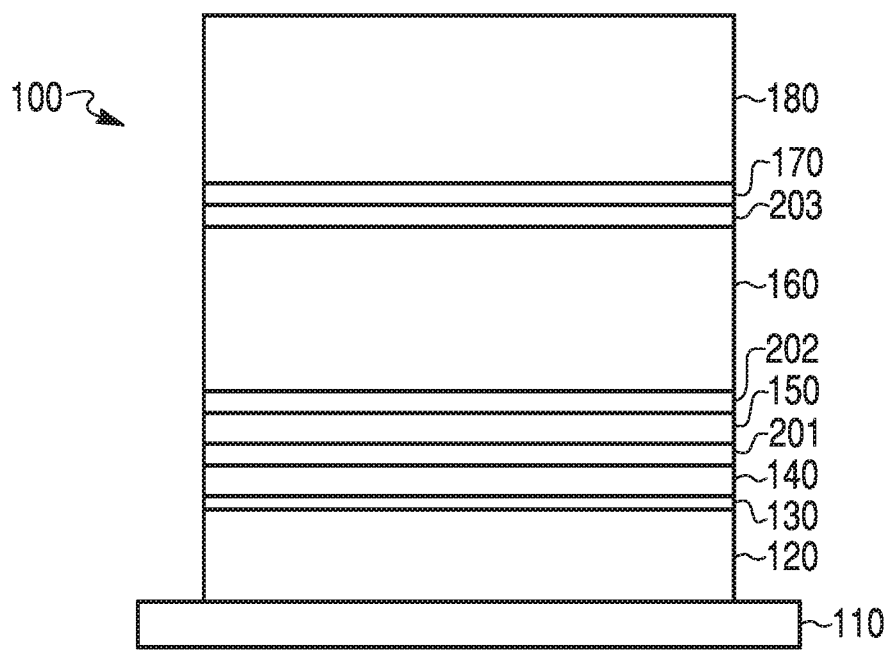

For example, referring to FIG. 12, a magnetoresistive structure 100 may include a first insertion layer 201 disposed between transition layer 150 and fixed region 160, a second insertion layer 202 disposed between fixed region 160 and cap region 170, and a third insertion layer 203 disposed between cap region 170 and top electrode 180. In another example, as shown in FIG. 13, magnetoresistive structure 100 may include a first insertion layer 201 disposed between reference layer 140 and transition layer 150, a second insertion layer 202 disposed between transition layer 150 and fixed region 160, and a third insertion layer 203 disposed between cap region 170 and top electrode 180. Referring to FIG. 14, in some embodiments, magnetoresistive structure 100 may include a first insertion layer 201 disposed between reference layer 140 and transition layer 150, a second insertion layer 202 disposed between fixed region 160 and cap region 170, and a third insertion layer 203 disposed between cap region 170 and top electrode 180. In some examples, magnetoresistive structure 100 may include a first insertion layer 201 disposed between reference layer 140 and transition layer 150, a second insertion layer 202 disposed between transition layer 150 and fixed region 160, and a third insertion layer 203 disposed between fixed region 160 and cap region 170, as shown in FIG. 15.

Figure 16:
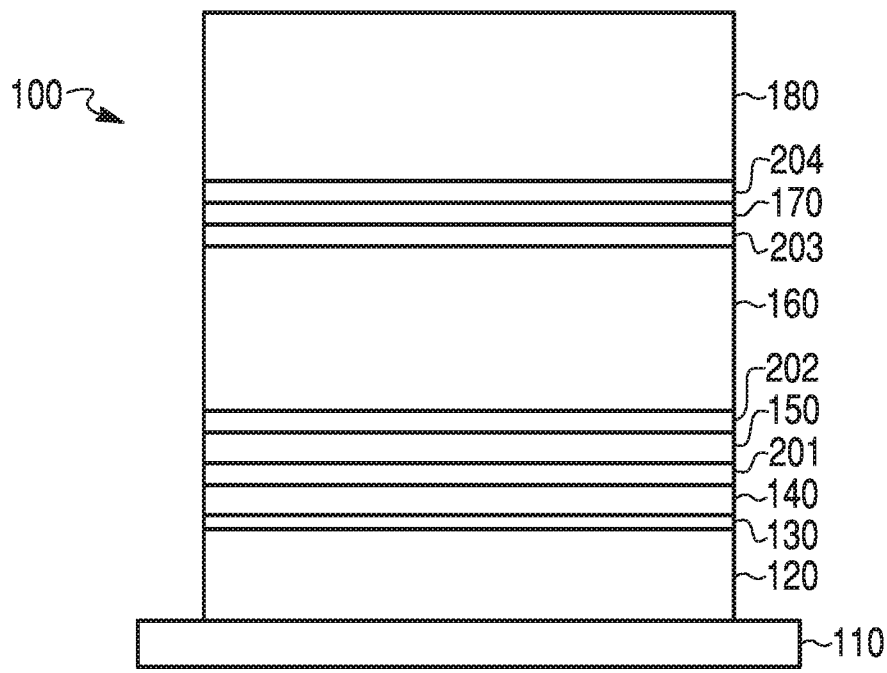

Referring to FIG. 16, a magnetoresistive structure 100 may include four insertion layers (e.g., first insertion layer 201, second insertion layer 202, third insertion layer 203, and fourth insertion layer 204). In some embodiments, fourth insertion layer 204 may have the same composition as first insertion layer 201, second insertion layer 202, and/or third insertion layer 203. In addition or alternatively, one or more insertion layers 201, 202, 203, 204 may have a different composition than at least one other insertion layer 201, 202, 203, 204. Fourth insertion layer 204 may have a similar thickness as first insertion layer 201, second insertion layer 202, or third insertion layer 203, as described above. In some embodiments, fourth insertion layer 204 may have a thickness less than a thickness of first insertion layer 201, second insertion layer 202, and/or third insertion layer 203. In addition or alternatively, fourth insertion layer 204 may have a thickness greater than a thickness of first insertion layer 201, second insertion layer 202, and/or third insertion layer 203.

Still referring to FIG. 16, magnetoresistive structure 100 may include a first insertion layer 201 disposed between reference layer 140 and transition layer 150, a second insertion layer 202 disposed between transition layer 150 and fixed region 160, a third insertion layer 203 disposed between fixed region 160 and cap region 170, and a fourth insertion layer 204 disposed between cap region 170 and top electrode 180.

Without being limited by theory, inclusion of one or more insertion layers 201, 202, 203, 204 may induce a localized magnetic field. For example, after magnetoresistive structure 100 is formed, one or more subsequent processing steps (e.g., annealing) may be performed that induces a magnetic moment in one or more insertion layers 201, 202, 203, 204, thereby generating a localized magnetic field. The induced localized magnetic field may facilitate, improve, and/or maintain the transfer of spin current from SH material 110 to free region 120.

For example, referring to FIG. 17A, a magnetoresistive structure 100 may include an insertion layer 201. The magnetic moment of the insertion layer 201, represented by arrow 301, may induce a localized stray magnetic field 304. The localized stray magnetic field 304 may have a magnitude of approximately 10 oersted (Oe) to approximately 600 Oe. As current (represented by arrow 302) passes through SH material 110, spin current (represented by arrows 303) is imparted from SH material 110 to free region 120. When the magnetic moment of one or more insertion layers (e.g., insertion layer 201) is parallel or anti-parallel to the current 302 passed through SH material 110, the induced localized stray magnetic field 304 may improve the transfer of spin current 303 from SH material 110 to free region 120.

FIG. 17B shows a cross section, taken at line 17B-17B, of the magnetoresistive structure 100 shown in FIG. 17A. As can be seen in FIG. 17B, one or more insertion layers (e.g., insertion layer 201) may be ovular, elongated, elliptical, or other non-rectangular shape. One or more other layers and/or regions of magnetoresistive structure 100 (e.g., free region 120, intermediate layer 130, reference layer 140, transition layer 150, fixed region 160, cap region 170) may be ovular, elongated, elliptical, or other non-rectangular shape. Magnetoresistive structures 100 that include one or more layers and/or regions with a non-rectangular shape, may have a shape anisotropy that contributes to the magnetic moment one or more magnetic or anti-ferromagnetic layers of the magnetoresistive structure 100.

After one or more layers and/or regions of a magnetoresistive structure 100 are formed, further processing steps may be undertaken to insure that the magnetoresistive device structure has the desired magnetic properties. For example, the further processing steps may include an annealing step that fixes the magnetic properties of one or more insertion layers 201, 202, 203, 204 and/or one or more magnetic layers (e.g., magnetic layers of fixed region 160). During annealing, an external magnetic field may be applied. The magnitude and/or direction of the localized stray magnetic field 304, induced by one or more insertion layers 201, 202, 203, 204, may be at least partially dependent on the angle of magnetic field applied during annealing. During annealing, a magnetic field may be applied in a direction at that is approximately 35 to approximately 55° (e.g., approximately 40° to 50°, or approximately 45°) incident, in the x-y plane, to a line of SH material 110 (e.g., the direction of current traveling through SH material 110). Other suitable incident angles may be used, such that the resulting insertion layer 201, 202, 203, 204 has a magnetic moment that is parallel or anti-parallel to the direction current flows through SH material 110.

As described previously, one or more devices or systems may include a series of magnetoresistive structures 100, positioned along a linear SH material 110. The layers and regions of each magnetoresistive structure 100 above the connecting SH material 110 may be referred to as a stack 200. For example, referring to the magnetoresistive structure 100 shown in FIG. 18, the stack 200 includes free region 120, intermediate layer 130, reference layer 140, transition layer 150, fixed region 160, cap region 170, and top electrode 180. In other embodiments, stack 200 may include one or more insertion layers 201, 202, 203, 204. A segment of SH material 110 may be connected to a series of stacks 200 arranged in a line or other array.

In the methods described above, an external magnetic field is required during annealing to break the symmetry of magnetoresistive structure 100, and induce a magnetic moment in one or more layers and/or regions of stack 200. Additionally or in the alternative, one or more layers and/or regions of magnetoresistive structure 100 may be etched in a manner to create an asymmetric magnetoresistive structure 100, imparting the desired magnetic properties to one or more layers and/or regions of stack 200. In FIGS. 18-24C, the stack 200 shown is similar to the stack 100 shown in FIG. 1. However, this is only for ease of illustration, the embodiment methods may be used with any stack 200 or magnetoresistive structure 100 described herein.

Referring to FIGS. 18-24C, similar to FIGS. 17A and 17B, each magnetoresistive structure 100 is drawn such that SH material 110 lies in an x-y plane and each layer and/or region of each stack 200 lies in a generally parallel x-y plane, displaced along a z-axis. This orientation of each region, layer, and structure, shown in FIGS. 18-24C is for clarity of description only. Other configurations, placements, and orientations of layers and/or regions are contemplated.

An exemplary method of manufacturing a magnetoresistive stack with SOT switching (e.g., a magnetoresistive stack including one of the geometries discussed above) will now be discussed with reference to FIGS. 18-24C. As previously stated, commonly performed conventional techniques related to semiconductor processing may not be specifically described herein. Rather, the description herein is intended to highlight aspects of example methods of manufacturing a magnetoresistive structure described herein.

FIG. 18 shows a magnetoresistive structure, during a manufacturing process, according to one or more embodiments of the present disclosure. For example, in at least one embodiment, FIG. 18 shows a magnetoresistive structure after SH material 110, free region 120, intermediate layer 130, reference layer 140, transition layer 150, fixed region 160, cap region 170, and top electrode 180 have been formed. As described above, each layer or region may lie in an x-y plane, displaced from each neighboring layer or region along a z-axis.

In some embodiments, after SH material 110, free region 120, intermediate layer 130, reference layer 140, transition layer 150, fixed region 160, cap region 170, and top electrode 180 have been formed, at least a portion of top electrode 180, cap region 170, fixed region 160, transition layer 150, reference layer 140, and/or intermediate layer 130 may be removed (e.g., etched). For example, referring to FIG. 19, after at least a portion of top electrode 180, cap region 170, fixed region 160, transition layer 150, reference layer 140, and/or intermediate layer 130 are removed, the remaining portions of reference layer 140, transition layer 150, fixed region 160, cap region 170, and top electrode 180 may have a diameter (e.g., a width along the x and/or y-axis) less than a diameter of free region 120. In some embodiments, portions of the reference layer 140 are removed up to the edge of intermediate layer 130. In other embodiments, these portions of reference layer 140 may be "over-etched." In other words, a portion of intermediate layer 130 may be removed with the portions of top electrode 180, cap region 170, fixed region 160, transition layer 150, reference layer 140, and/or intermediate layer 130.

In some embodiments, after at least a portion of top electrode 180, cap region 170, fixed region 160, transition layer 150, reference layer 140, and/or intermediate layer 130 are removed, one or more oxides (e.g., auxiliary oxide, silica, etc.) or nitrides (e.g. $Si_xN_y$) may be applied to the stack (e.g., the etched magnetoresistive stack) by, for example, physical vapor deposition (PVD), chemical vapor deposition (CVD), other thin film fabrication processes, and/or other technique known in the art. FIG. 20 shows an etched magnetoresistive structure that has been coated with auxiliary oxide (i.e., an oxide-coated magnetoresistive stack), according to one or more embodiments.

Still referring to FIG. 20, in one or more embodiments, an oxide region 190 is formed over intermediate layer 130, reference layer 140, transition layer 150, fixed region 160, cap region 170, and/or top electrode 180. As used herein, oxide region 190 may refer to a region that includes oxides (e.g., auxiliary oxide, silica, etc.) and/or nitrides (e.g., $Si_xN_y$). In some embodiments, the oxide-coated magnetoresistive stack may include one or more oxide regions 190 disposed above and in contact with intermediate layer 130. Oxide region 190 may cover the entire top surface of substrate top electrode 180 and/or intermediate layer 130. In other embodiments, only part of the top surface intermediate layer 130 is covered by oxide region 190. In some, oxide may be applied such that oxide region 190 contacts, or completely covers the thickness of, reference layer 140, transition layer 150, fixed region 160, cap region 170, and/or top electrode 180. Oxide region 190 may be conformal around the magnetoresistive stack and cover the vertical side walls of one or more regions of the magnetoresistive stack (e.g., reference layer 140, transition layer 150, fixed region 160, cap region 170, and/or top electrode 180).

In some embodiments, after oxide region 190 is formed, one or more etching processes (e.g., processes where one or more layers are etched, abraded, and/or otherwise polished) may be performed on the oxide-coated magnetoresistive stack. For example, referring to FIG. 21, at least a portion of oxide region 190, intermediate layer 130, and/or free region 120 may be removed from the oxide-coated magnetoresistive structure. In some embodiments, at least a portion of free region 120 may be removed such that one or more side-walls of free region 120 have a tapered edge (i.e., free region 120 includes a tapered side-wall). For example, the bottom surface of free region 120 (e.g., the surface that contacts SH material 110) may have a diameter (e.g., a width in the x or y direction) greater than a diameter of the top surface of free region 120 (e.g., the surface that contacts intermediate layer 130).

Referring to FIGS. 22A-22C, after a free region 120 including a tapered side-wall is formed, at least a portion of intermediate layer 130, free region 120, and/or SH material 110 may be removed to form a stack 200 that is asymmetrical with respect to a longitudinal axis of SH material 110. For example, a cross-section near the top of stack 200 (e.g., a cross section including top electrode 180 and oxide region 190) may have a smaller diameter than a cross-section near the bottom of stack 200 (e.g., a cross section including free region 120). In some embodiments, free region 120 may be "over-etched." Stated differently, a portion of SH material 110, below the etched portion of free region 120, may also be removed by the etch.

Referring to FIG. 22A, a cross-section in the z-y plane of stack 200, after at least a portion of intermediate layer 130, free region 120, and/or SH material 110 are removed, is symmetrical with respect to a longitudinal axis of stack 200. As described previously, when current 302 is passed through SH material 110, spin current 303 is injected into free region 120 from SH material 110. Referring to FIG. 22B, a cross-section in the z-y plane of stack 200, after at least a portion of intermediate layer 130, free region 120, and/or SH material 110 are removed, is asymmetrical with respect to a longitudinal axis of stack 200. As shown in FIG. 22B, the magnetic moments 305 of free region 120 combine to form an overall magnetic moment in free region 120 towards the removed portion of free region 120 (e.g., towards a side-wall that is no longer tapered). This asymmetrical magnetic moment may assist in imparting the desired magnetic properties into stack 200 and/or promoting, facilitating, maintaining, or otherwise assisting in the transfer of spin current 303 from SH material 110 to free region 120. Although the right wall of free region 120 is shown to be vertical in FIG. 22B, this is one example. In other embodiments, free region 120 may still have tapered side-walls as long as the composite magnetic moments 305 of free region 120 are asymmetrical.

The shape of the stack shown in FIGS. 22A-22C may be formed, for example, by performing a selective angle etch on the magnetoresistive stack 200 comprising a free region 120 including a tapered side-wall. As would be recognized by a person skilled in the art, typically, the substrate being etched is rotated during etching (e.g., by ion beam etching (IBE)). In some embodiments, the magnetoresistive structure is not rotated while an angled etch is performed, removing more material on one side of the stack 200 than an opposing side of stack 200.

Referring again to the oxide-coated magnetoresistive stack shown in FIG. 20, a selective angle etch may be performed on the oxide-coated magnetoresistive stack to remove at least a portion of oxide region 190. In some embodiments, the magnetoresistive structure is not rotated while an angled etch is performed, removing more material on one side of the stack 200 than an opposing side of stack 200. After a portion of oxide region 190 is removed from the oxide-coated magnetoresistive stack, an asymmetrical magnetoresistive stack 200, such as, for example, the stack 200 shown in FIG. 23, may be formed.

Still referring to FIG. 23, after at least a portion of oxide region 190 is removed, magnetoresistive stack 200 may include one or more oxide regions 190 disposed above and in contact with intermediate layer 130. Oxide region 190 may cover the entire top surface of substrate top electrode 180 and/or intermediate layer 130. In other embodiments, only part of the top surface intermediate layer 130 is covered by oxide region 190. In some embodiments, oxide region 190 contacts, or completely covers the thickness of, reference layer 140, transition layer 150, fixed region 160, cap region 170, and/or top electrode 180. Even after at least a portion of oxide region 190 is removed, oxide region 190 may be conformal around the magnetoresistive stack and cover the vertical side walls of one or more regions of the magnetoresistive stack (e.g., reference layer 140, transition layer 150, fixed region 160, cap region 170, and/or top electrode 180).

After a selective angle etch is performed on an oxide-coated magnetoresistive stack (resulting in, e.g., the asymmetrical structure shown in FIG. 23), at least a portion of SH material 110, free region 120, intermediate layer 130, reference layer 140, transition layer 150, fixed region 160, cap region 170, top electrode 180 and/or cap region 190 may be removed, resulting in an asymmetrical magnetoresistive structure, such as, for example, the one shown in FIGS. 24A-24C. In some embodiments, at least a portion of free region 120 may be removed such that one or more side-walls of free region 120 have a tapered edge (i.e., free region 120 includes a tapered side-wall). For example, the bottom surface of free region 120 (e.g., the surface that contacts SH material 110) may have a diameter (e.g., a width in the x or y direction) greater than a diameter of the top surface of free region 120 (e.g., the surface that contacts intermediate layer 130).

Referring to FIGS. 24A-24C, after a free region 120 including a tapered side-wall is formed, the stack 200 may be asymmetrical with respect to a longitudinal axis of SH material 110. For example, a cross-section near the top of stack 200 (e.g., a cross section including top electrode 180 and oxide region 190) may have a smaller diameter than a cross-section near the bottom of stack 200 (e.g., a cross section including free region 120). In some embodiments, free region 120 may be "over-etched." Stated differently, a portion of SH material 110, below the etched portion of free region 120, may also be removed by the etch.

Referring to FIG. 24A, a cross-section in the z-y plane of stack 200, after the free region 120 with a tapered side-wall is formed, is symmetrical with respect to a longitudinal axis of stack 200. As described previously, when current 302 is passed through SH material 110, spin current 303 is injected into free region 120 from SH material 110. Referring to FIG. 24B, a cross-section in the z-y plane of stack 200, after the free region 120 with a tapered side-wall is formed, is asymmetrical with respect to a longitudinal axis of stack 200. As shown in FIG. 24B, the magnetic moments 305 of free region 120 combine to form an overall magnetic moment in free region 120 towards the removed portion of free region 120 (e.g., towards a side-wall that is no longer tapered). As described above, this asymmetrical magnetic moment may assist in imparting the desired magnetic properties into stack 200 and/or promoting, facilitating, maintaining, or otherwise assisting in the transfer of spin current 303 from SH material 110 to free region 120. Although the right wall of free region 120 is shown to be angled with respect to a vertical axis and non-parallel to the right wall of intermediate layer 130, this is one example. In other embodiments, free region 120 may have one or more vertical side-walls, as long as the composite magnetic moments 305 of free region 120 are asymmetrical.

FIG. 25 is a flow chart of a method 400 of manufacturing a magnetoresistive structure 100 utilizing STT and/or SOT switching, according to one or more embodiments of the present disclosure. The method 400 may include forming an SH material 110 segment (step 401). The method 400 may further include forming a magnetoresistive stack 200 including one or more insertion layers 201, 202, 203, 204, where each insertion layer 201, 202, 203, 204 includes an antiferromagnetic material (step 402). In some embodiments, the method 400 may include applying a magnetic field to the magnetoresistive stack 200 (step 403). The method 400 may further include annealing the magnetoresistive stack 200, wherein, after annealing, the one or more insertion layers 201, 202, 203, 204 have a magnetic moment parallel or antiparallel to the SH material segment (step 404).

FIG. 26 is a flow chart of a method 500 of manufacturing a magnetoresistive structure 100 utilizing STT and/or SOT switching, according to one or more embodiments of the present disclosure. The method 500 may include forming a magnetoresistive stack 200, including a dielectric layer (e.g., intermediate layer 130) and a free region 120, on a segment of SH material 110 (step 501). The method 500 may further include removing at least a portion of one or more layers of the magnetoresistive stack 200, exposing at least a portion of the dielectric layer (e.g., intermediate layer 130), and forming an etched magneto resistive stack (step 502). In some embodiments, the method 500 may include depositing an auxiliary oxide on the etched magnetoresistive stack, forming an oxide region 190 (step 503). The method 500 may further include removing at least a portion of each of the auxiliary oxide (e.g., from an oxide region 190), the dielectric layer, and the free region 120, forming a free region 120 including a tapered side-wall (step 504). In some examples, method 500 may further include using a selective angle etch to remove at least a portion of the free region 120 including a tapered sidewall (step 505).

FIG. 27 is a flow chart of a method 600 of manufacturing a magnetoresistive structure 100 utilizing STT and/or SOT switching, according to one or more embodiments of the present disclosure. The method 600 may include forming a magnetoresistive stack 200, including a dielectric layer (e.g., intermediate layer 130) and a free region 120, on a segment of SH material 110 (step 601). The method 600 may further include removing at least a portion of one or more layers of the magnetoresistive stack 200, exposing at least a portion of the dielectric layer (e.g., intermediate layer 130), and forming an etched magneto resistive stack (step 602). In some embodiments, the method 600 may include depositing an auxiliary oxide on the etched magnetoresistive stack, forming an oxide region 190 (step 603). The method 600 may further include removing at least a portion of the auxiliary oxide (e.g., from an oxide region 190) using a selective angle etch (step 604). In some examples, method 600 may further include removing at least a portion of each of the auxiliary oxide (e.g., from an oxide region 190), the dielectric layer (e.g., intermediate layer 130), and the free region 120, forming a free region 120 including a tapered side-wall.

As alluded to above, the magnetoresistive devices of the present disclosure, including one or more switching geometries described herein, may be implemented in a sensor architecture or a memory architecture (among other architectures). For example, in a memory configuration, the magnetoresistive devices may be electrically connected to an access transistor and configured to couple or connect to various conductors, which may carry one or more control signals, as shown in FIG. 28. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 29A) or an embedded memory device having a logic therein (e.g., as shown in FIG. 29B), each including MRAM, which, in one embodiment is representative of one or more arrays of MRAM having a plurality of magnetoresistive stacks, according to certain aspects of certain embodiments disclosed herein.

In one embodiments, a magnetoresistive device is disclosed. The device includes a top electrode, a magnetically fixed region, a magnetically free region positioned above or below the magnetically fixed region, and an intermediate region (e.g., a dielectric layer) positioned between the magnetically fixed region and the magnetically free region. The magnetoresistive device may also include a spin Hall material proximate to at least a portion of the free region and an insertion layer disposed between the SH material and the top electrode, wherein the insertion layer comprises antiferromagnetic material.

Various embodiments of the disclosed magnetoresistive device may additionally or alternatively also include one or more of the following features: the insertion layer may comprise manganese; the SH material may comprise at least one of platinum, beta-tungsten, tantalum, palladium, hafnium, gold, an alloy including gold, an alloy including bismuth and selenium, an alloy including copper, an alloy including manganese, iridium, selenium, or one or more combinations thereof; the insertion layer may have a thickness less than or equal to approximately 2.0 nanometers; the insertion layer may be a first insertion layer and the device may further comprise a second insertion layer; a transition layer between the dielectric layer and the fixed region, and a cap region between the fixed region and the top electrode, wherein the first insertion layer, the second insertion layer, or both, are in contact with the cap region or the transition layer; and/or a third insertion layer in contact with the cap region or the transition layer.

In another embodiment, a magnetoresistive device is disclosed. The magnetoresistive device may include a magnetically fixed region, a magnetically free region positioned above or below the magnetically fixed region, and an intermediate region (e.g., a dielectric layer) positioned between the magnetically fixed region and the magnetically free region. A spin Hall channel material may be proximate to at least a portion of the magnetically free region. A cap region may be on the opposite of the fixed region from the free region. The device may include a transition layer between the intermediate layer and the fixed region and at least one insertion layer adjacent to the cap region or the transition layer, wherein the at least one insertion layer comprises antiferromagnetic material.

Various embodiments of the disclosed magnetoresistive device may additionally or alternatively also include one or more of the following features: the insertion layer may comprise manganese; the insertion layer may further comprise iridium or platinum; the insertion layer may have a thickness less than or equal to approximately 2.0 nanometers; current flowing in a first direction through the SH material may switch the free region to the first magnetic state, and current flowing in a second direction may switch the free region to the second magnetic state; the fixed region may include a synthetic antiferromagnetic structures (SAF); the at least one insertion layer may be a first insertion layer and the device may further comprise a second insertion layer adjacent to the cap region or the transition layer; and/or the device may further include a reference layer between the transition layer and the dielectric layer.

In another embodiment, a method of fabricating a magnetoresistive device is disclosed. The method may include forming a segment of SH material and forming a magnetoresistive stack in contact with the SH material, wherein the magnetoresistive stack includes a dielectric layer and a free region configured to switch between a first magnetic state and a second magnetic state. The method may also include removing at least a portion of one or more layers of the magnetoresistive stack to form an etched magnetoresistive stack. The method may further include depositing oxide (and/or nitride), thereby forming at least one oxide region. The method may also include, removing at least a portion of the oxide region and/or removing at least a portion of the free region, forming a free region including a tapered side wall.

Various embodiments of the disclosed method may also include one or more of the following features: a second etching step including the step of removing at least a portion of the oxide region, the step of removing at least a portion of the free region, or both; a selective angle etch; removing at least a portion of one or more layers of the magnetoresistive stack to form the etched magnetoresistive stack may include exposing at least a portion of the dielectric layer; and/or after forming a free region including a tapered side-wall, the magnetoresistive stack may be asymmetrical about a longitudinal axis of the magnetoresistive stack that is perpendicular to a surface of SH material that is in contact with free region.

Although various embodiments of the present disclosure have been illustrated and described in detail, it will be readily apparent to those skilled in the art that various modifications may be made without departing from the present disclosure.

What is claimed is:

1. A magnetoresistive device comprising:
a top electrode;
a fixed region below the top electrode, the fixed region having a fixed magnetic state;
a free region below the fixed region, wherein the free region is configured to have a first magnetic state and a second magnetic state;
a dielectric layer between the free region and the fixed region;
a spin-Hall (SH) material proximate to at least a portion of the free region;
an insertion layer disposed between the SH material and the top electrode, wherein the insertion layer comprises antiferromagnetic material; and
a transition layer between the dielectric layer and the fixed region, the transition layer including a non-ferromagnetic transition metal, wherein the transition layer is configured to assist the formation of a reference layer between the dielectric layer and the insertion layer.

2. The device of claim 1, wherein the insertion layer comprises manganese.

3. The device of claim 1, wherein the SH material comprises at least one of platinum, beta-tungsten, tantalum, palladium, hafnium, gold, an alloy including gold, an alloy including bismuth and selenium, an alloy including copper, an alloy including manganese, iridium, selenium, or one or more combinations thereof.

4. The device of claim 1, wherein the insertion layer has a thickness less than or equal to approximately 2.0 nm.

5. The device of claim 1, wherein the insertion layer is a first insertion layer and the device further comprises a second insertion layer.

6. The device of claim 5, further comprising:
a cap region between the fixed region and the top electrode,
wherein the first insertion layer, the second insertion layer, or both, are in contact with the cap region or the transition layer.

7. The device of claim 6, further comprising a third insertion layer in contact with the cap region or the transition layer.

8. A magnetoresistive device comprising:
a fixed region having a fixed magnetic state;
a free region configured to switch between a first magnetic state and a second magnetic state;
a dielectric layer between the free region and the fixed region;
a spin-Hall (SH) material proximate to at least a portion of the free region;
a cap region above the fixed region;
a transition layer between the dielectric layer and the fixed region; and
at least one insertion layer adjacent to the cap region or the transition layer, wherein the at least one insertion layer comprises antiferromagnetic material, the transition layer including a non-ferromagnetic transition metal, wherein the transition layer is configured to assist the formation of a reference layer between the dielectric layer and the at least one insertion layer.

9. The device of claim 8, wherein the insertion layer comprises manganese.

10. The device of claim 9, wherein the insertion layer further comprises iridium or platinum.

11. The device of claim 10, wherein the insertion layer has a thickness less than or equal to approximately 2.0 nm.

12. The device of claim 8, wherein a current flowing in a first direction through the SH material switches the free region to the first magnetic state, and wherein a current flowing in a second direction switches the free region to the second magnetic state.

13. The device of claim 8, wherein the fixed region includes a synthetic antiferromagnetic structure (SAF).

14. The device of claim 8, wherein the at least one insertion layer is a first insertion layer and the device further comprises a second insertion layer adjacent to the cap region or the transition layer.

15. The device of claim 8, wherein the reference layer is between the transition layer and the dielectric layer.

16. A magnetoresistive device comprising:
a top electrode;
a fixed region having a fixed magnetic state;
a free region configured to have a first magnetic state and a second magnetic state;
a dielectric layer between the free region and the fixed region;
a spin-Hall (SH) material proximate to at least a portion of the free region;
a first insertion layer disposed between the free region and the top electrode;
a second insertion layer disposed between the first insertion layer and the free region,
wherein the first and second insertion layers include antiferromagnetic material; and
a transition layer between the dielectric layer and the fixed region, the transition layer including a non-ferromagnetic transition metal, wherein the transition layer is configured to assist the formation of a reference layer between the dielectric layer and the first insertion layer or the second insertion layer.

17. The magnetoresistive device of claim 16, wherein the first insertion layer, the second insertion layer, or both, comprise a platinum-manganese alloy, an iridium-manganese alloy, an iron-manganese alloy, chromium, or a combination thereof.

18. The magnetoresistive device of claim 17, wherein the first and second insertion layers induce a stray magnetic field having a magnitude of approximately 10 oersted to approximately 600 oersted.

19. The magnetoresistive device of claim 16, wherein the reference layer is between the dielectric layer and the fixed region.

20. The magnetoresistive device of claim 16, further comprising:
a cap region disposed between the fixed region and the top electrode; and
a third insertion layer disposed between the first insertion layer and the second insertion layer, wherein the third insertion layer includes manganese.

* * * * *